(12) United States Patent
Lin et al.

(10) Patent No.: US 12,439,625 B2
(45) Date of Patent: Oct. 7, 2025

(54) SEMICONDUCTOR DEVICE STRUCTURE AND METHOD FOR FORMING THE SAME

(71) Applicant: TAIWAN SEMICONDUCTOR MANUFACTURING COMPANY, LTD., Hsinchu (TW)

(72) Inventors: Kan-Ju Lin, Kaohsiung (TW); Chien Chang, Hsinchu (TW); Chih-Shiun Chou, Hsinchu (TW); Tai Min Chang, Taipei (TW); Yi-Ning Tai, Taoyuan (TW); Hong-Mao Lee, Hsinchu (TW); Yan-Ming Tsai, Miaoli (TW); Wei-Yip Loh, Hsinchu (TW); Harry Chien, Hsinchu (TW); Chih-Wei Chang, Hsinchu (TW); Ming-Hsing Tsai, Hsinchu (TW); Lin-Yu Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 560 days.

(21) Appl. No.: 17/750,996

(22) Filed: May 23, 2022

(65) Prior Publication Data
US 2023/0411496 A1 Dec. 21, 2023

(51) Int. Cl.
*H10D 30/01* (2025.01)
*H10D 30/62* (2025.01)
(Continued)

(52) U.S. Cl.
CPC ....... *H10D 30/024* (2025.01); *H10D 30/6211* (2025.01); *H10D 30/6219* (2025.01); *H10D 84/013* (2025.01); *H10D 84/038* (2025.01)

(58) Field of Classification Search
CPC ....... H01L 29/66795; H01L 21/823418; H01L 29/41791; H01L 29/7851; H10D 30/024;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

TW 202218084 A 5/2022

*Primary Examiner* — Syed I Gheyas
(74) *Attorney, Agent, or Firm* — NZ Carr Law Office

(57) ABSTRACT

A semiconductor structure and method of forming a semiconductor structure are provided. In some embodiments, the method includes forming a gate structure over a substrate. An epitaxial source/drain region is formed adjacent to the gate structure. A dielectric layer is formed over the epitaxial source/drain region. An opening is formed, the opening extending through the dielectric layer and exposing the epitaxial source/drain region. Sidewalls of the opening are defined by the dielectric layer and a bottom of the opening is defined by the epitaxial source/drain region. A silicide layer is formed on the epitaxial source/drain region. A metal capping layer including tungsten, molybdenum, or a combination thereof is selectively formed on the silicide layer by a first deposition process. The opening is filled with a first conductive material in a bottom-up manner from the metal capping layer by a second deposition process different from the first deposition process.

20 Claims, 19 Drawing Sheets

(51) Int. Cl.
*H10D 84/01* (2025.01)
*H10D 84/03* (2025.01)

(58) Field of Classification Search
CPC ........... H10D 30/6211; H10D 30/6219; H10D 84/013; H10D 84/038
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2019/0164752 A1* | 5/2019 | Chi .................... H01L 21/32051 |
| 2019/0348511 A1* | 11/2019 | Karpov ............... H01L 27/0886 |
| 2020/0035558 A1* | 1/2020 | Ching ................ H01L 21/28247 |
| 2021/0104431 A1 | 4/2021 | Khaderbad et al. |

\* cited by examiner

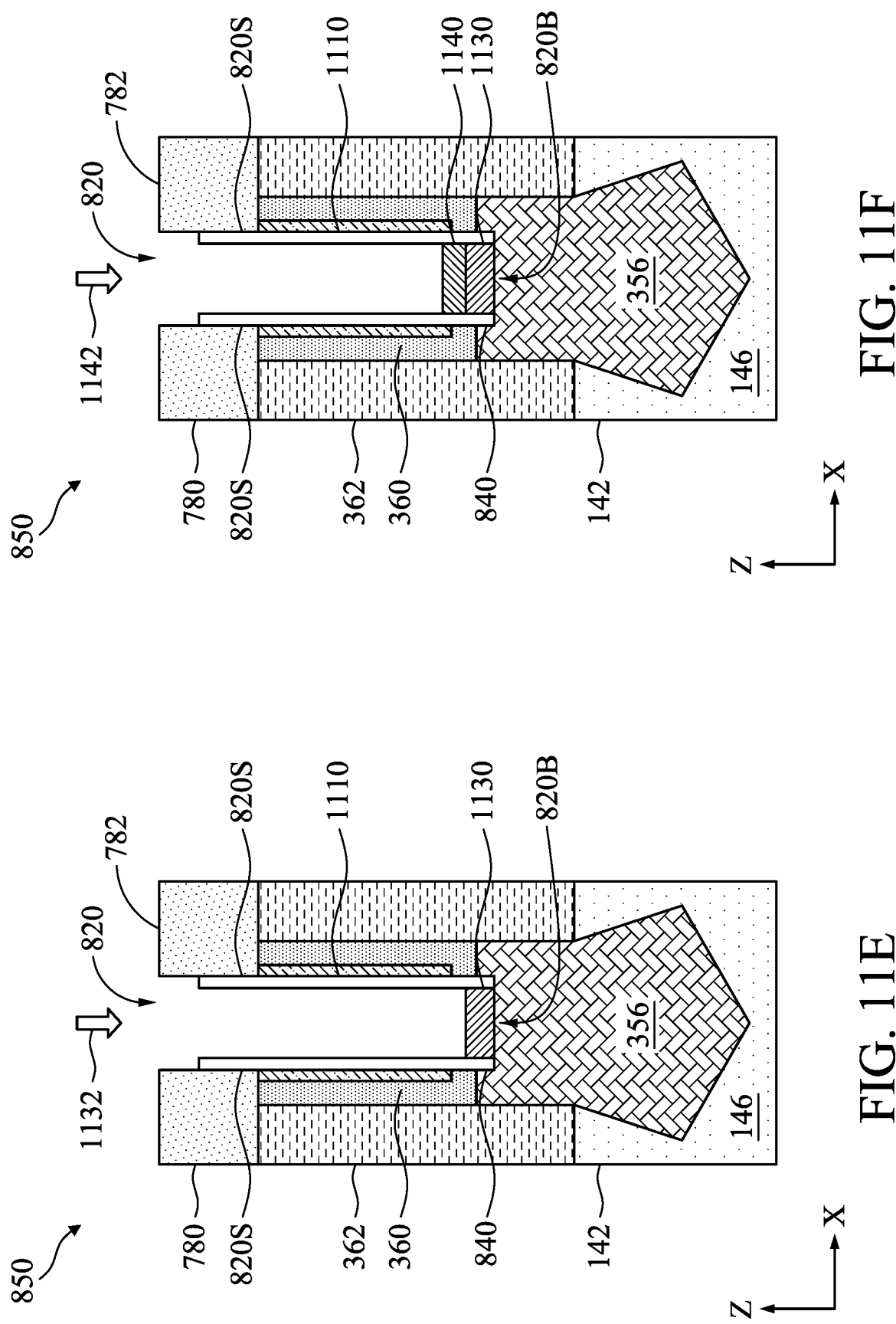

SEMICONDUCTOR DEVICE STRUCTURE AND METHOD FOR FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate. The various material layers can also be patterned using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11H are enlarged views of a portion of the semiconductor device structure of FIG. 8 during various manufacturing states in accordance with some embodiments.

DETAILED DESCRIPTION

Figure 1:
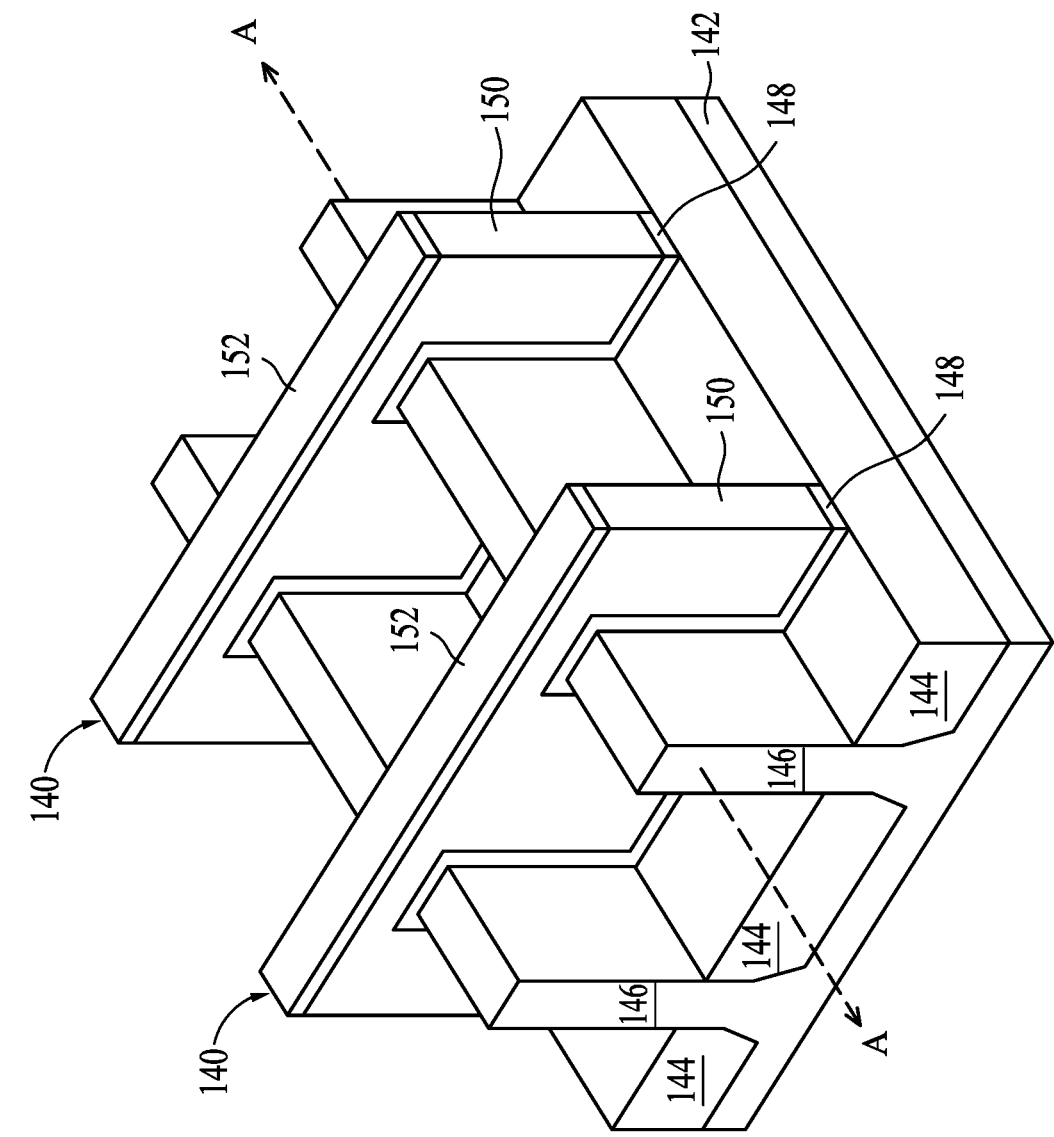
FIG. 1 is a perspective view of a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

A semiconductor device structure and methods of forming the same are provided in accordance with some embodiments. The semiconductor device structure can be a fin field-effect transistor (FinFET) device, a complementary metal-oxide semiconductor (CMOS) device, a silicon-on-insulator (SOI) device, a Metal-Oxide-Semiconductor Field-Effect (MOSFET) device, or the like. Embodiments will be described with respect to a specific context, namely, a FinFET device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around (GAA) transistor devices, nanowire transistor devices, or the like.

As semiconductor devices scale down to advanced or exploratory technology nodes, such as 10 nm, 7 nm, 5 nm, 3 nm nodes or beyond, the complexity of IC processing and manufacturing is increased, and the related process window is reduced. Electric resistances of interconnect structures are a challenge for these fine wires. Nitridation or metal nitride is often used to cap silicide materials and prevent oxidation of the underlying silicide materials. However, the incorporation of nitrogen from nitridation or metal nitride provides an additional interface, which increases the overall resistance of the subsequently formed contact plugs. In addition, the nitridation or metal nitride may undergo oxidation during vacuum break, this oxidation is not only difficult to remove but contributes additional resistance to the subsequently formed contact plugs. Various embodiments discussed herein allow for forming low-resistance contact plugs. Various embodiments discussed herein allow for enlarging gapfill capability while forming contact plugs and reducing contact plug resistance by non-conformally and selectively forming metal capping layers on a silicide layer, by eliminating nitride and metal nitride barrier layers, and by improving bottom-up fill capability. In some embodiments, a metal cap and metal capping method for capping a silicide layer are provided. The metal cap serves the dual purpose of preventing oxidation of the underlying silicide material as well as serving as a seed layer for subsequent selective bottom-up fill growth. The same metal capping layer serving these two purposes reduces the interface resistance as well as the cost of forming the semiconductor device.

FIGS. 1 through 8 illustrate views of a semiconductor device structure 100 at respective stages during an example method for forming conductive features in accordance with some embodiments. FIG. 1 illustrates a perspective view of the semiconductor device structure 100 at a stage of the example method. The semiconductor device structure 100, as described in the following, is used in the implementation of FinFETs. The FinFET structure illustrated in FIG. 1 is provided for illustrative purposes only and is not meant to limit the scope of the present disclosure. Other structures may be implemented in other example embodiments.

The semiconductor device structure 100 includes first and second fins 146 (collectively "fins") formed on a semiconductor substrate 142, with respective isolation regions 144 on the semiconductor substrate 142 between neighboring fins 146. First and second dummy gate stacks 140 (collectively "the dummy gate stacks") are along respective sidewalls of and over the fins 146. The dummy gate stacks 140 each include an interfacial dielectric 148, a dummy gate 150, and a mask 152.

The semiconductor substrate 142 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 142 may include an elemental semiconductor, for example, such as silicon (Si) or germanium (Ge); a compound semiconductor including, for example, silicon carbide, gallium arsenic, gallium phosphide, indium phosphide, indium arsenide, and/or indium antimonide; an alloy semiconductor including, for example, SiGe, GaAsP, AlInAs, AlGaAs, GaInAs, GaInP, and/or GaInAsP; a combination thereof; or the like.

The fins 146 may be formed in the semiconductor substrate 142. For example, the semiconductor substrate 142 may be etched, such as by appropriate photolithography and etch process, such that trenches are formed between neighboring pairs of fins 146 and such that the fins 146 protrude from the semiconductor substrate 142. Isolation regions 144 are formed with each being in a corresponding trench. The isolation regions 144 may include or be an insulating material such as an oxide (such as silicon oxide), a nitride, the like, or a combination thereof. The insulating material may then be recessed after being deposited to form the isolation regions 144. The insulating material is recessed using an acceptable etch process such that the fins 146 protrude from between neighboring isolation regions 144, which may, at least in part, thereby delineate the fins 146 as active areas on the semiconductor substrate 142. The fins 146 may be formed by other processes, and may include homoepitaxial and/or heteroepitaxial structures, for example.

The dummy gate stacks 140 are formed on the fins 146. In a replacement gate process as described herein, the interfacial dielectrics 148, dummy gates 150, and masks 152 for the dummy gate stacks 140 may be formed by sequentially forming respective layers by appropriate deposition processes, for example, and then patterning the respective layers into the dummy gate stacks 140 by appropriate photolithography and etch processes. For example, the interfacial dielectrics 148 may include or be silicon oxide, silicon nitride, the like, or multilayers thereof. The dummy gates 150 may include or be silicon (e.g., polysilicon) or another material. The masks 152 may include one or more layers, for example, a hardmask layer and a corresponding photoresist. In some embodiments where the masks 152 include a hardmask layer, the masks 152 may include or be silicon oxide, silicon nitride, silicon oxynitride, silicon carbide, silicon carbon nitride, a combination thereof, or the like.

In other examples, instead of and/or in addition to the dummy gate stacks 140, the semiconductor device structure shown in FIG. 1 can include operational gate stacks (or more generally, gate structures) formed in a gate-first process. In a gate-first process, the interfacial dielectric 148 may be a gate dielectric layer, and the dummy gate 150 may be a gate electrode. The gate dielectric layers, gate electrodes, and the masks 152 for the operational gate stacks may be formed by sequentially forming respective layers by appropriate deposition processes, and then patterning those layers into the gate stacks by appropriate photolithography and etch processes. For example, the gate dielectric layers may include or be silicon oxide, silicon nitride, a high-k dielectric material, the like, or multilayers thereof. A high-k dielectric material may have a k value greater than about 7.0 and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate electrodes may include or be silicon (e.g., polysilicon, which may be doped or undoped), a metal-containing material (such as titanium, tungsten, aluminum, ruthenium, or the like), a combination thereof (such as a silicide (which may be subsequently formed), or multiple layers thereof. The masks 152 may comprise or be silicon oxide, silicon nitride, silicon oxynitride, silicon carbide, silicon carbon nitride, a combination thereof, or the like.

Figure 2:
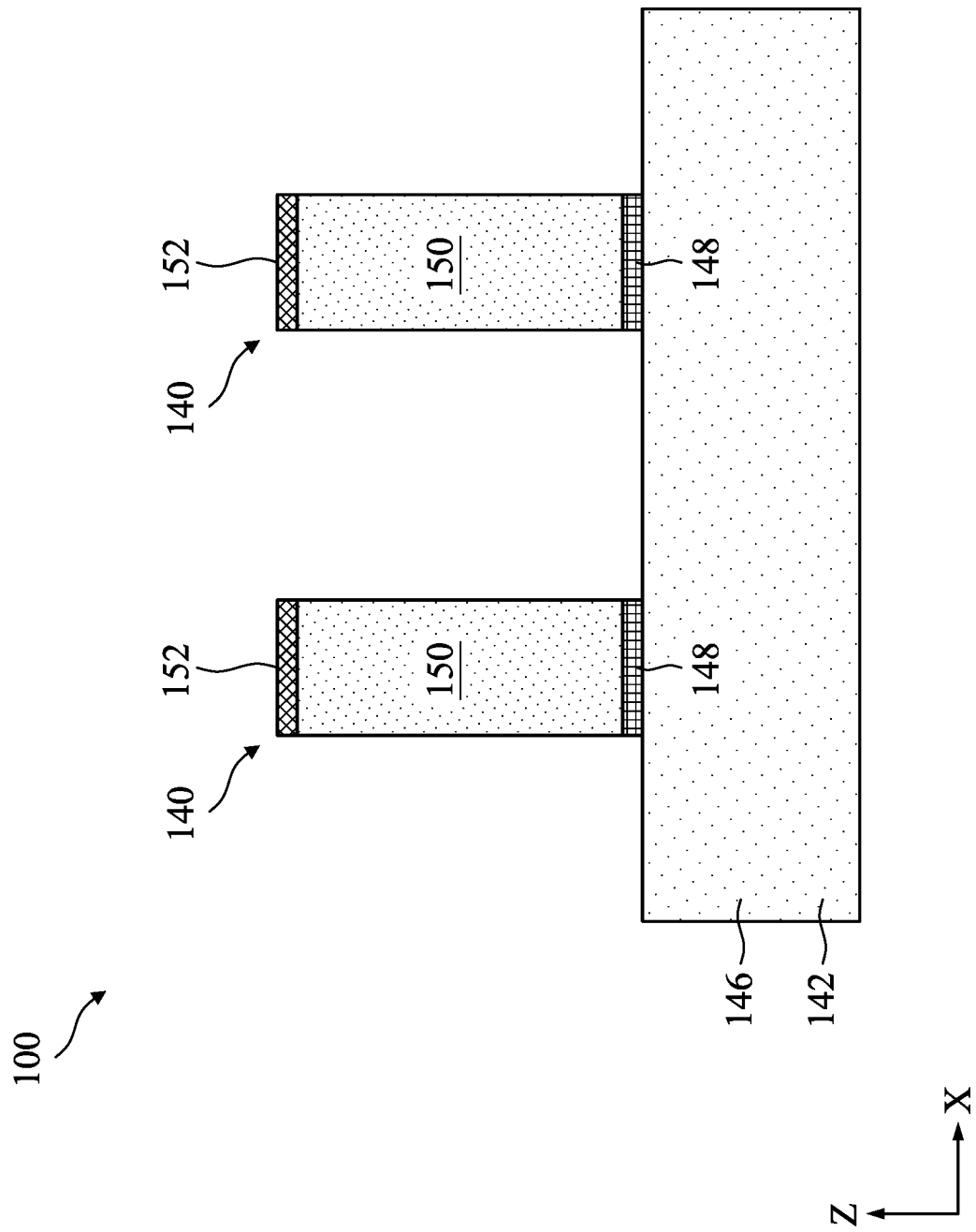
FIGS. 2-8, 10, and 12 are cross-sectional side views of various stages of manufacturing the semiconductor device structure of FIG. 1 taken along cross-section A-A in accordance with some embodiments.

FIG. 1 further illustrates a reference cross-section that is used in later figures. Cross-section A-A is in a plane along, e.g., channels in the fin 146 between opposing source/drain regions. FIGS. 2 through 8 illustrate cross-sectional views at various stages of processing in various example methods corresponding to cross-section A-A. FIG. 2 illustrates a cross-sectional view of the semiconductor device structure 100 of FIG. 1 at the cross-section A-A.

Figure 3:
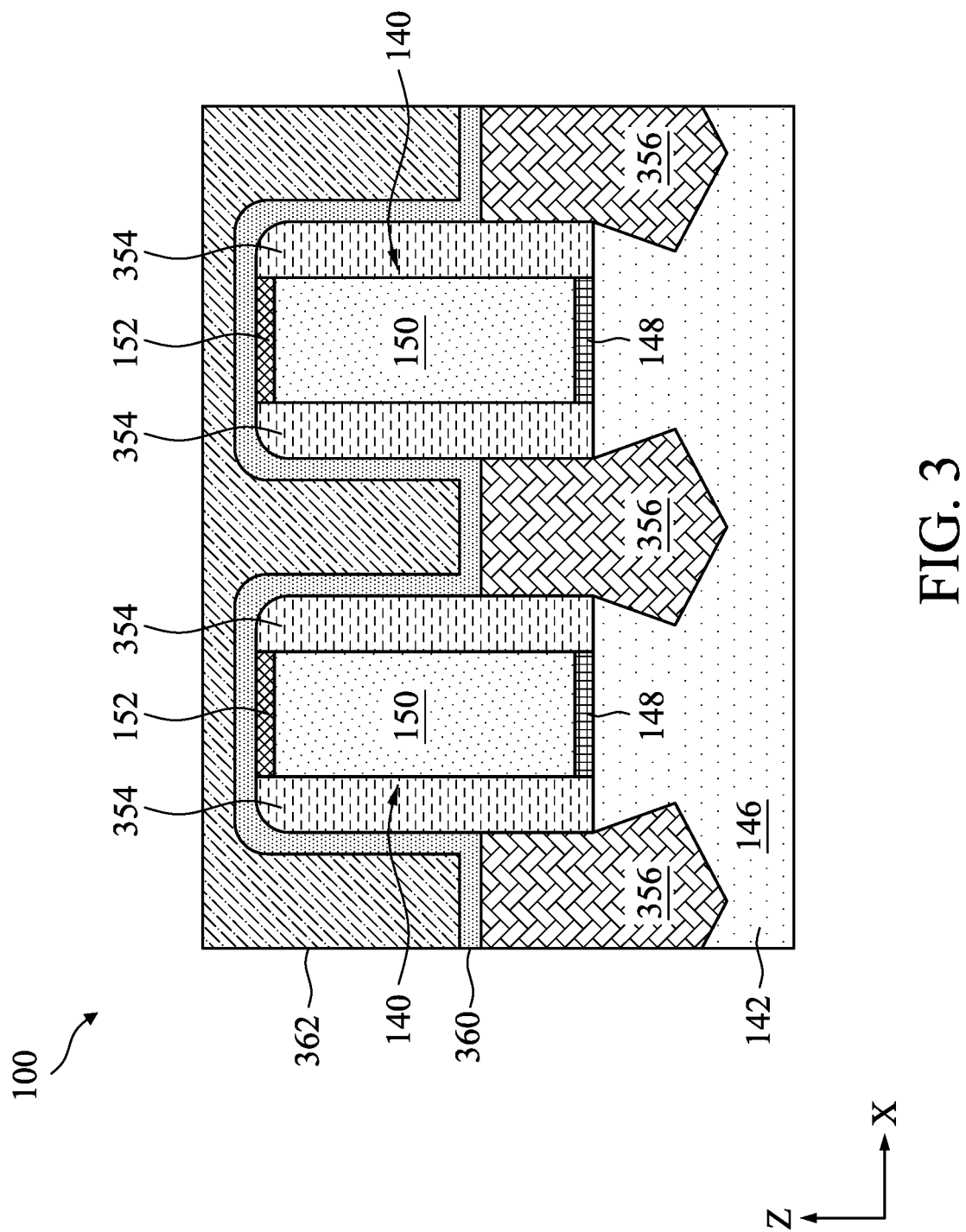

FIG. 3 illustrates the formation of gate spacers 354, epitaxial source/drain regions 356, a contact etch stop layer (CESL) 360, and a first interlayer dielectric (ILD) 362. The gate spacers 354 are formed along sidewalls of the dummy gate stacks 140 (e.g., sidewalls of the interfacial dielectrics 148, the dummy gates 150, and the masks 152) and over the fins 146. The gate spacers 354 may be formed by conformally depositing, by an appropriate deposition process, one or more layers for the gate spacers 354 and anisotropically etching the one or more layers, for example. The one or more layers for the gate spacers 354 may include or be silicon oxygen carbide, silicon nitride, silicon oxynitride, silicon carbon nitride, a combination thereof, multi-layers thereof, or the like.

After forming the gate spacers 354, recesses are formed in the fins 146 on opposing sides of the dummy gate stacks 140 by an etch process, which uses the dummy gate stacks 140 and gate spacers 354 as a combined mask. The etch process can be isotropic or anisotropic, or further, may be selective with respect to one or more crystalline planes of the semiconductor substrate 142. Suitable anisotropic dry etching processes may include a reactive ion etch (RIE), a neutral beam etch (NBE), a combination thereof, or the like. Hence, the recesses can have various cross-sectional profiles based on the etch process implemented. The epitaxial source/drain regions 356 are formed in the recesses. The epitaxial source/drain regions 356 may include or be silicon, silicon germanium, silicon carbide, silicon phosphorus, silicon carbon phosphorus, pure or substantially pure germanium, a III-V compound semiconductor, a II-VI compound semiconductor, or the like. The epitaxial source/drain regions 356 may be formed in the recesses by an appropriate epitaxial growth or deposition process. In some examples, epitaxial source/drain regions 356 can be raised with respect to the fin 146, and can have facets, which may correspond to crystalline planes of the semiconductor substrate 142.

A person having ordinary skill in the art will also readily understand that the recessing and epitaxial growth may be omitted, and that source/drain regions may be formed by implanting dopants into the fins 146 using the dummy gate stacks 140 and gate spacers 354 as masks. In some examples where epitaxial source/drain regions 356 are implemented, the epitaxial source/drain regions 356 may also be doped, such as by in-situ doping during epitaxial growth and/or by implanting dopants into the epitaxial source/drain regions 356 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

The CESL 360 is conformally deposited by an appropriate deposition process, on surfaces of the epitaxial source/drain regions 356, sidewalls and top surfaces of the gate spacers 354, top surfaces of the masks 152, and top surfaces of the isolation regions 144. Generally, an etch stop layer (ESL) can provide a mechanism to stop an etch process when forming, e.g., contacts or vias. An ESL may be formed of a dielectric material having a different etch selectively from adjacent layers or components. In some embodiments, the CESL 360 may include or be silicon nitride, silicon oxynitride, silicon oxycarbide, silicon carbonitride, silicon carbon oxide, silicon carboxynitride, carbon nitride, a combination thereof, or the like. In some embodiments, the CESL 360 may be formed using CVD, ALD, a combination thereof, or the like.

In some embodiments, the first ILD 362 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, spin-on-glass, spin-on-polymers, silicon carbon material, a compound thereof, a composite thereof, a combination thereof, or the like. The first ILD 362 is deposited, by an appropriate deposition process, on the CESL 360. In some embodiments, the first ILD 362 is formed using CVD, PECVD, a spin-on-glass process, a combination thereof, or the like.

The first ILD 362 may be planarized after being deposited, such as by a chemical mechanical polishing (CMP). In a gate-first process, a top surface of the first ILD 362 may be above the upper portions of the CESL 360 and the gate stacks, and processing described below with respect to FIG. 4 and FIG. 5 may be omitted. Hence, the upper portions of the CESL 360 and first ILD 362 may remain over the gate stacks.

Figure 4:
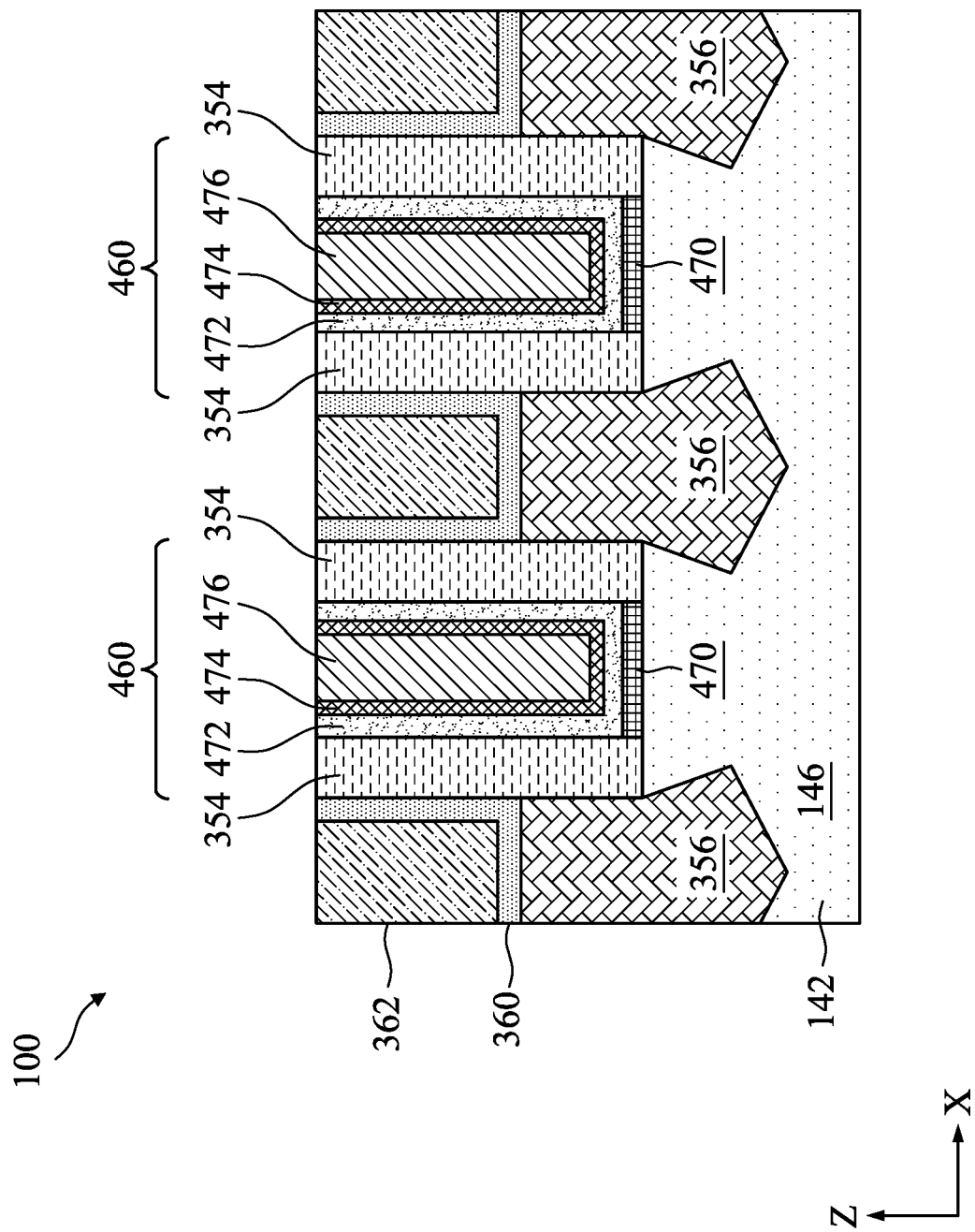

FIG. 4 illustrates the replacement of the dummy gate stacks 140 with replacement gate structures 460. Prior to replacement of the dummy gate stacks 140 with the replacement gate structures as shown in FIG. 4, the first ILD 362 and the CESL 360 are formed with top surfaces coplanar with top surfaces of the dummy gates 150. A planarization process, such as a CMP process, may be performed to level the top surfaces of the first ILD 362 and the CESL 360 with the top surfaces of the dummy gates 150. The CMP may also remove the masks 152 (and, in some instances, upper portions of the gate spacers 354) on the dummy gates 150. Accordingly, top surfaces of the dummy gates 150 are exposed through the first ILD 362 and the CESL 360.

With the dummy gates 150 exposed through the first ILD 362 and the CESL 360, the dummy gates 150 are removed, such as by one or more etch processes. The dummy gates 150 may be removed by an etch process selective to the dummy gates 150, where the interfacial dielectrics 148 function as ESLs, and subsequently, the interfacial dielectrics 148 can optionally be removed by a different etch process selective to the interfacial dielectrics 148. Recesses (not shown) are formed between the gate spacers 354 where the dummy gate stacks 140 are removed, and channel regions of the fins 146 are exposed through the recesses.

Figure 6:
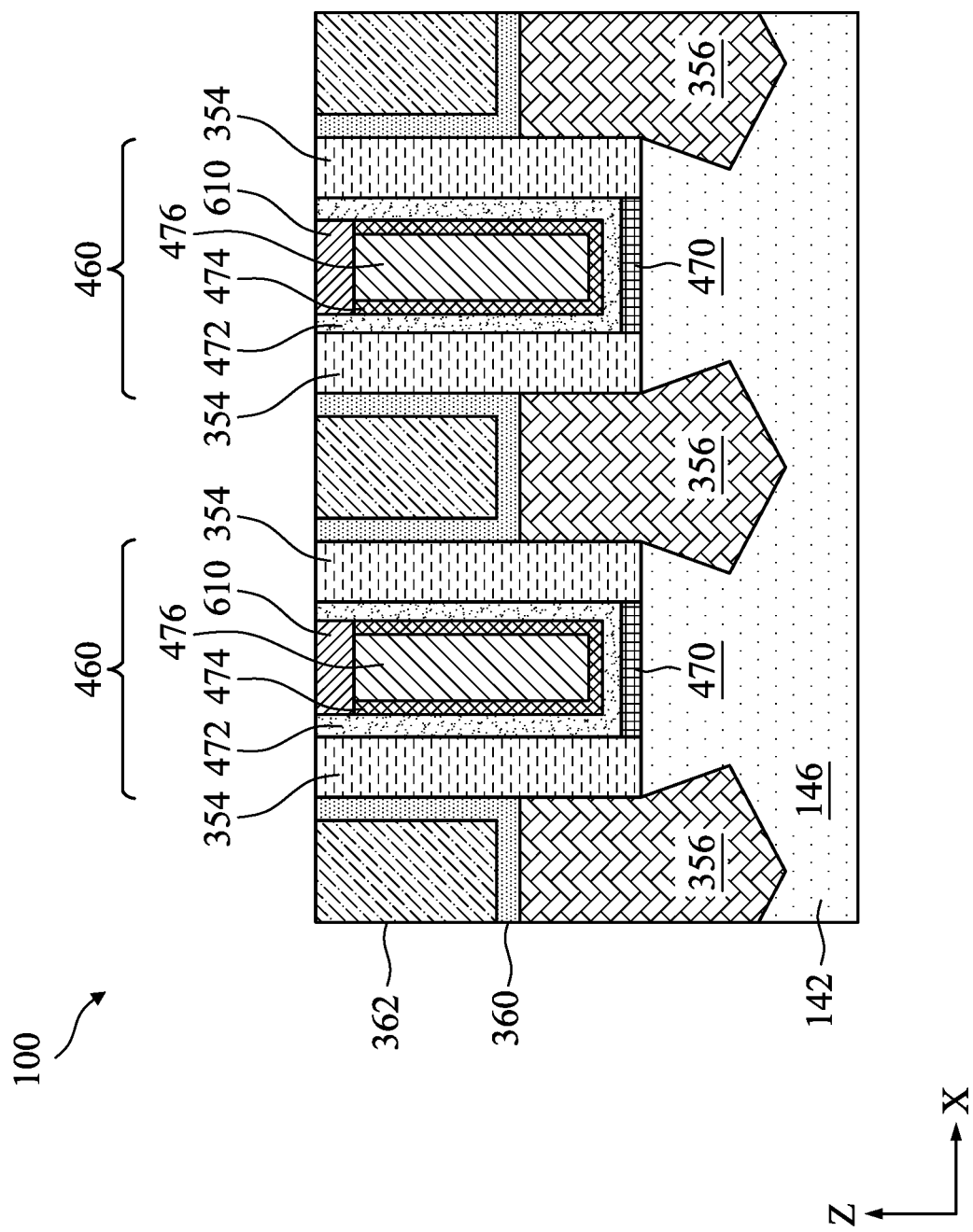

The replacement gate structures 460 are formed in the recesses where the dummy gate stacks 140 were removed. The replacement gate structures 460 each include, as illustrated, an interfacial dielectric 470, a gate dielectric layer 472, one or more optional conformal layers 474, and a gate electrode layer 476. In some embodiments, the replacement gate structures 460 further include a metal gate capping layer, for example, metal gate caping layer 610 as shown in FIG. 6. In other embodiments, the metal gate capping layer 610 is not present. The interfacial dielectric 470 is formed on sidewalls and top surfaces of the fins 146 along the channel regions. The interfacial dielectric 470 can be, for example, the interfacial dielectric 148 if not removed, an oxide (e.g., silicon oxide) formed by thermal or chemical oxidation of the fin 146, and/or an oxide (e.g., silicon oxide), nitride (e.g., silicon nitride), and/or another dielectric layer.

The gate dielectric layer 472 can be conformally deposited in the recesses where the dummy gate stacks 140 were removed (e.g., on top surfaces of the isolation regions 144, on the interfacial dielectric 470, and sidewalls of the gate spacers 354) and on the top surfaces of the first ILD 362, the CESL 360, and the gate spacers 354. The gate dielectric layer 472 can be or include silicon oxide, silicon nitride, a high-k dielectric material (examples of which are provided above), multilayers thereof, or other dielectric material. In some embodiments, the gate dielectric layer 472 is formed using Molecular-Beam Deposition (MBD), ALD, PECVD, a combination thereof, or the like. In some embodiments, the gate dielectric layer 472 may have a thickness in a range from about nm to about 5 nm.

Then, the one or more optional conformal layers 474 can be conformally (and sequentially, if more than one) deposited on the gate dielectric layer 472. The one or more optional conformal layers 474 can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate electrode layer 476 is formed over the one or more optional conformal layers 474 (e.g., over the one or more work-function tuning layers), if implemented, and/or the gate dielectric layer 472. The gate electrode layer 476 can fill remaining recesses where the dummy gate stacks 140 were removed. In some embodiments, the gate electrode layer 476 may include one or more layers of suitable conductive material. The gate electrode layer 476 may be or include a metal-containing material such as tungsten, cobalt, aluminum, ruthenium, copper, multi-layers thereof, a combination thereof, or the like. The gate electrode layer 476 may be formed using any suitable process such as ALD, CVD, PVD, plating, a combination thereof, or the like. Portions of the gate electrode layer 476, the one or more optional conformal layers 474, and the gate dielectric layer 472 above the top surfaces of the first ILD 362, the CESL 360, and the gate spacers 354 may be removed by a planarization process, such as by a CMP process. In some embodiments, after the planarization process, the gate electrode layer 476 may have a thickness in a range from about 5 nm to about 50 nm.

The replacement gate structures 460, including the gate electrode layer 476, the one or more optional conformal layers 474, the gate dielectric layer 472, and the interfacial dielectric 470, may therefore be formed as illustrated in FIG. 4.

Figure 5:
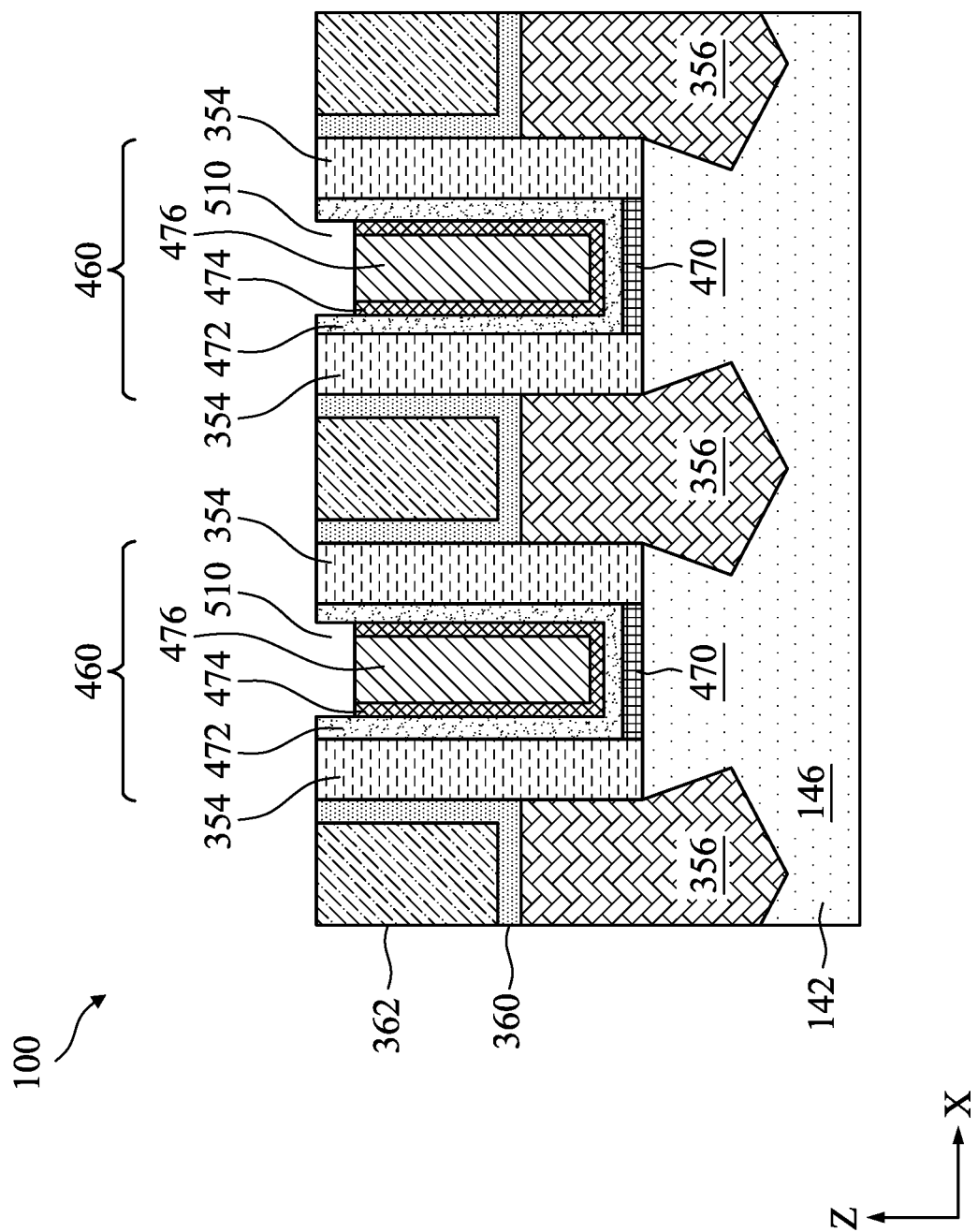

Turning to FIG. 5, in some embodiments where the replacement gate structures 460 further include the metal gate capping layer 610, the replacement gate structures 460 are each recessed to form recess 510. The recess 510 may be formed using an etching process (e.g., a dry etching process, a wet etching process, or a combination thereof). In some embodiments, the etching process removes top portions of the gate dielectric layer 472, top portions of the optional conformal layer 474 (if present), top portions of the gate electrode layer 476, and/or top portions of the gate spacers 354. In some embodiments, the etching rate of the gate electrode layer 476 is higher than the etching rate of the gate dielectric layer 472 such that the top surfaces of the gate electrode layer 476 are lower than the top surfaces of the gate dielectric layer 472. In some embodiments, the etching rate of the gate electrode layer 476 and the optional conformal layers 474 are higher than the etching rate of the gate dielectric layer 472 such that the top surfaces of the gate electrode layer 476 and the optional conformal layers 474 are lower than the top surfaces of the gate dielectric layer 472 as shown in FIG. 5. In some embodiments, the recess 510 may have a depth in a range from about 1 nm to about 10 nm.

Turning to FIG. 6, a deposition process is performed to form the metal gate capping layer 610 on at least the top surfaces of the gate electrode layer 476 in the recess 510. In some embodiments, the metal gate capping layer 610 and the underlying gate electrode layer 476 include different materials so that the metal gate capping layer 610 can protect the underlying gate electrode layer 476 from damage during subsequent processing. The metal gate capping layer 610 may be or include a metal-containing material such as tungsten, cobalt, aluminum, ruthenium, titanium, copper, molybdenum, multi-layers thereof, a combination thereof, or the like.

In some embodiments, the metal gate capping layer 610 may be formed using any suitable process such as ALD, CVD, PVD, plating, a combination thereof, or the like. In some embodiments, the deposition process includes selectively forming the metal gate capping layer 610 on the top surfaces of the gate electrode layer 476 by bottom-up growth. The metal gate capping layer 610 formed by bottom-up growth may have fewer defects (e.g., seams), which may improve the performance of the semiconductor device structure 100. In some embodiments, the metal gate capping layer 610 may have a thickness in a range from about 1 nm to about 10 nm.

The replacement gate structures 460 including optionally the metal gate capping layer 610, the gate electrode layer 476, the one or more optional conformal layers 474, the gate dielectric layer 472, and the interfacial dielectric 470 may therefore be formed as illustrated in FIG. 5 and FIG. 6.

Figure 7:
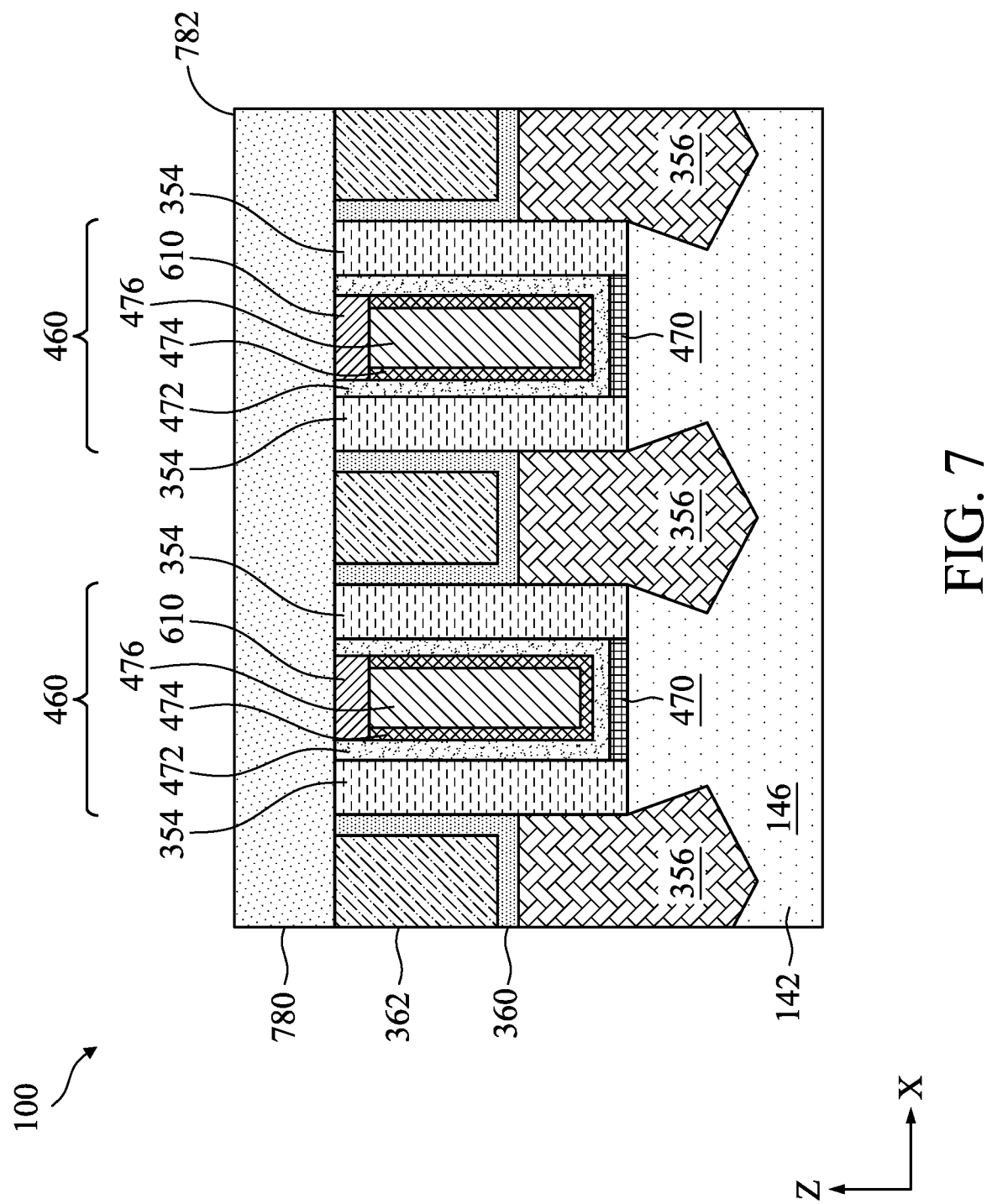

FIG. 7 illustrates the formation of a second ILD 780 over the first ILD 362, the CESL 360, the gate spacers 354, and the replacement gate structures 460. Although not illustrated, in some examples, an ESL may be deposited over the first ILD 362 and the second ILD 780 may be deposited over the ESL. If implemented, the ESL may include or be silicon nitride, silicon carbon nitride, silicon carbon oxide, carbon nitride, the like, or a combination thereof. In some embodiments, the second ILD 780 may be formed using similar materials and methods as the first ILD 362 described above with reference to FIG. 3, and the description is not repeated herein. In some embodiments, the second ILD 780 and the first ILD 362 are formed of a same material. In other embodiments, the second ILD 780 and the first ILD 362 are formed of different materials. The second ILD 780 may include or be silicon dioxide, a low-k dielectric material, silicon oxynitride, PSG, BSG, BPSG, USG, FSG, OSG, $SiO_xC_y$, spin-on-glass, spin-on-polymers, silicon carbon material, a compound thereof, a composite thereof, the like, or a combination thereof. In some embodiments, the second ILD 780 may have a thickness in a range from about 10 nm to about 100 nm. In some embodiments, the CESL 360, the first ILD 362, and the second ILD 780 may be patterned using one or more suitable etching processes, such as an anisotropic dry etching process, or the like.

Figure 8:
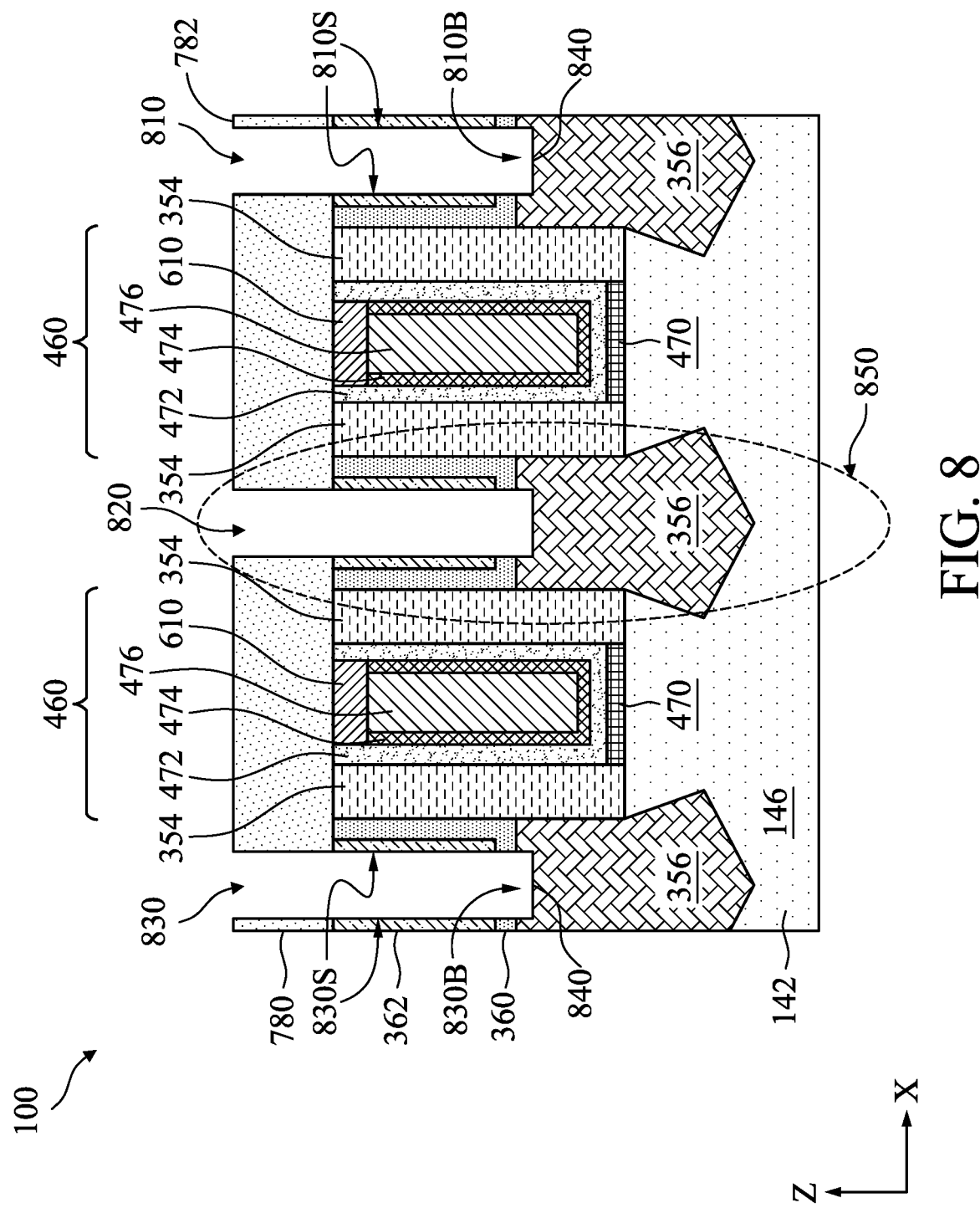

FIG. 8 illustrates the formation of one or more contact openings in the first ILD 362 and/or the second ILD 780 (and in some implementations, the CESL 360 and/or the epitaxial source/drain region 356) by a patterning process, such as an opening 810, an opening 820, and an opening 830. It should be noted that although three openings 810, 820 and 830 are shown, any number of contact openings may be formed. In the depicted embodiment, the opening 810 extends vertically through the second ILD 780, the first ILD 362, the CESL 360, and partially into the epitaxial source/drain region 356 to form a recessed portion 840 in the epitaxial source/drain region 356; the opening 820 extends vertically through the second ILD 780, the first ILD 362, the CESL 360, and partially into the epitaxial source/drain region 356 to form a recessed portion 840 in the epitaxial source/drain region 356; and the opening 830 extends vertically through the second ILD 780, the first ILD 362, the CESL 360, and partially into the epitaxial source/drain region 356 to form a recessed portion 840 in the epitaxial source/drain region 356. In some embodiments, the openings 810, 820 and 830 extend to a top surface of the epitaxial source/drain region 356 but do not form a recessed portion 840. The opening 810 includes sidewalls 810S (defined by the second ILD 780, the first ILD 362, the CESL 360, and the recessed portion 840) and a bottom 810B (defined by the epitaxial source/drain region 356) that extends between sidewalls 810S. The opening 820 includes sidewalls 820S (defined by the second ILD 780, the first ILD 362, the CESL 360, and the recessed portion 840) and a bottom surface 820B (defined by the epitaxial source/drain region 356) that extends between sidewalls 820S. The opening 830 includes sidewalls 830S (defined by the second ILD 780, the first ILD 362, the CESL 360, and the recessed portion 840) and a bottom 830B (defined by the epitaxial source/drain region 356) that extends between sidewalls 820S. In some embodiments, the openings 810, 820 and 830 each independently have a width in a range from about 3 nm to about 50 nm. In some embodiments, one or more of the sidewalls 810S, 820S, and 830S can be tapered. In some embodiments where one or more of the sidewalls 810S, 820S and 830S are tapered, the openings 810, 820 and 830 each independently have a top dimension in a range from about 4 nm to about 50 nm and a bottom dimension in a range from about 3 nm to about 48 nm, wherein the top dimension is greater than the bottom dimension. In some embodiments, the openings 810, 820 and 830 each independently have a height dimension in a range from about 15 nm to about 45 nm.

The openings 810, 820 and 830 are formed through the second ILD 780, the first ILD 362, and the CESL 360 to expose at least a portion of an epitaxial source/drain region 356. The second ILD 780, the first ILD 362, and the CESL 360 may be patterned, for example, using photolithography and one or more etch processes, such as an anisotropic dry etching process to form the openings 810, 820 and 830. As described below, the openings 810, 820 and 830 may be filled with one or more conductive materials to form contact plugs 952, 954 and 956 that provide electrical connections to the epitaxial source/drain regions 356.

The patterning process includes lithography processes and/or one or more etching processes, such as an anisotropic etching process for form the openings 810, 820 and 830. For example, forming the openings 810, 820 and 830 includes performing a lithography process to form a patterned resist layer over the second ILD 780 and performing an etching process to transfer a pattern defined in the patterned resist layer to the second ILD 780, the CESL 360, the first ILD 362, and/or the epitaxial source/drain region 356. The lithography process can include forming a resist layer on a top surface 782 of the second ILD 780 (for example, by spin-coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during a developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the second ILD 780, the CESL 360, the first ILD 362, and/or the epitaxial source/drain region 356, thereby exposing the epitaxial source/drain region 356. The etching process can include a dry etching process, a wet etching process, other suitable etching process, or combinations thereof. After the etching process, the patterned resist layer is removed from the second ILD 780, for example, by a resist stripping process. In some implementations, the second ILD 780 is used as etching mask to pattern the first ILD 362 and/or the CESL 360. Various selective etching processes can be performed to remove the second ILD 780, the CESL 360, the first ILD 362, and/or the epitaxial source/drain region 356 when forming the openings 810, 820 and 830. Alternatively, the exposure process can be implemented or replaced by other methods, such as maskless lithography, electron-beam writing, ion-beam writing, and/or nanoimprint technology.

Figure 9B:
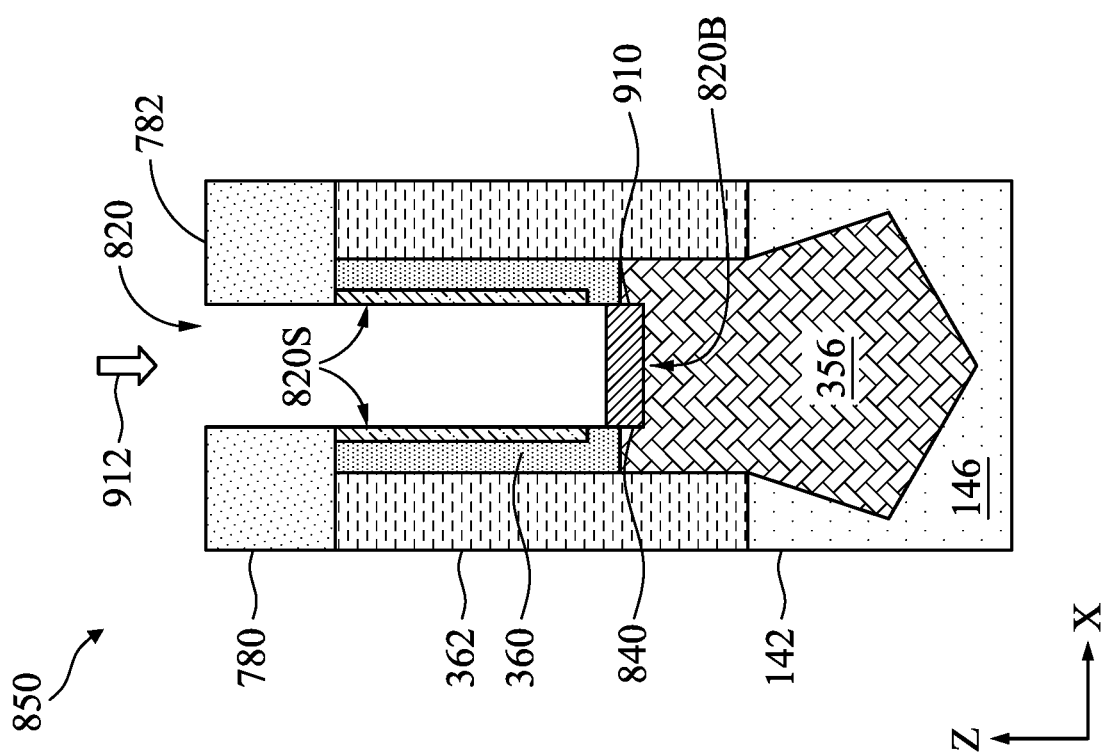
FIGS. 9A-9E are enlarged views of a portion of the semiconductor device structure of FIG. 8 during various manufacturing states in accordance with some embodiments.
Figure 9A:
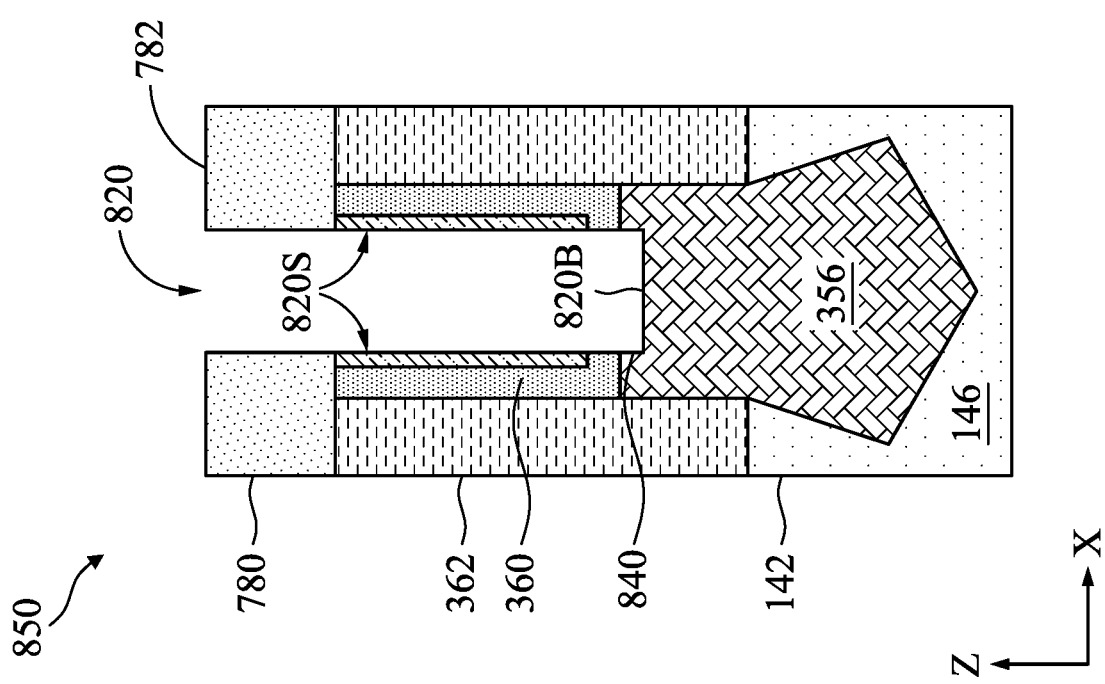

FIGS. 9A-9E are enlarged views of a portion 850 of the semiconductor device structure 100 of FIG. 8 during various manufacturing stages, in accordance with some embodiments. It should be noted that although FIGS. 9A-9E refer to the processing of the opening 820, similar materials and methods may be used on the opening 810 and the opening 830, and the description is not repeated herein. FIG. 9A is an enlarged view of the portion 850 of the semiconductor device structure 100 shown in FIG. 8. Next, as shown in FIG. 9B, self-aligned silicide layer 910 is formed through the opening 820 by a deposition process 912. In some embodiments, the deposition process 912 includes depositing a metallic material in the opening 820. The metallic material may comprise Ti, Co, Ni, NiCo, Pt, NiPt, Ir, PtIr, Er, Yb, Pd, Rh, Nb, W, Ru, Mo, a combination thereof, or the like. The metallic material may be formed using PVD, sputtering, or the like. The metallic material may be deposited on the exposed surface of the epitaxial source/drain region 356. If the recessed portion 840 is present, the metallic material may be formed in the recessed portion 840. Subsequently, an annealing process is performed to form the silicide layer 910. In some embodiments, where the epitaxial source/drain region 356 includes silicon, the annealing process causes the metallic material to react with the silicon to form a silicide of the metallic material. In some embodiments, the silicide layer 910 may be or includes TiSi, CoSi, NiSi, RuSi, MoSi, WSi, a combination thereof, or the like. In certain embodiments, the silicide layer 910 comprises TiSi. In some embodiments, the silicide layer 910 has a thickness in a range from about 1 nm to about 10 nm. The remaining metallic material may be removed by a selective etch process.

In other embodiments, the silicide layer 910 is formed using an in-situ thermal selective metal silicide process or a plasma-enhanced thermal selective metal silicide process. During the in-situ silicide process, the metallic material may be formed, for example, by a deposition process, such as a CVD process or an ALD process. In some embodiments, the deposition process is performed at a temperature lower than 600° C. to form the silicide layer 910. For example, the deposition process is performed at a temperature in a range from about 350° C. to about 500° C. In some embodiments, if the process temperature is lower than 350° C. precursor or by-product will be residual on wafer. While the deposition process is being performed, the metallic material reacts with the semiconductor material of the epitaxial source/drain region 356 to form the silicide layer 910 on the bottom surface 820B, for example, the exposed surface of the epitaxial source/drain region 356 of the opening 820. That is the silicide layer 910 is formed due to the deposition process. Therefore, after performing the deposition process, no annealing process is needed for formation of the silicide layer 910 on the epitaxial source/drain region 356. Thus, the silicide layer 910 and subsequent processing, for example, formation of a metal capping layer, can be performed in-situ (e.g., in the same chamber or on the same platform without removing for an anneal process) without exposing the silicide layer 910 to atmosphere where the silicide layer 910 can be damaged by oxidation, which increases resistance in the formed contact structure.

Figure 9D:
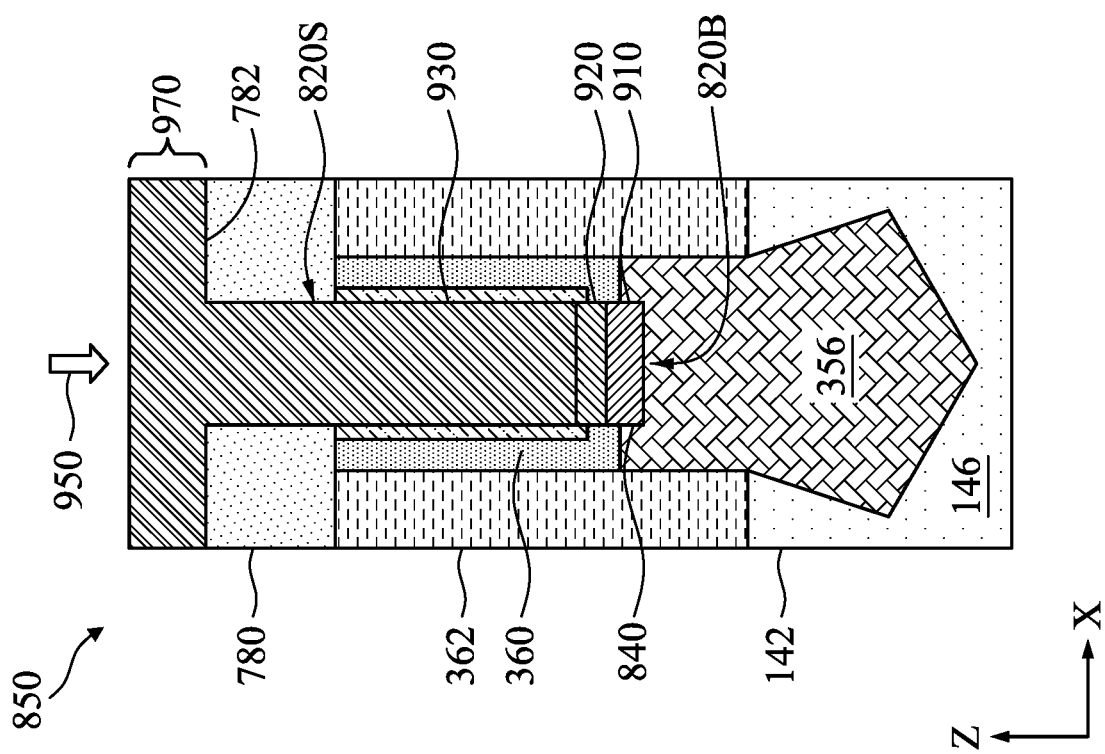
Figure 9C:
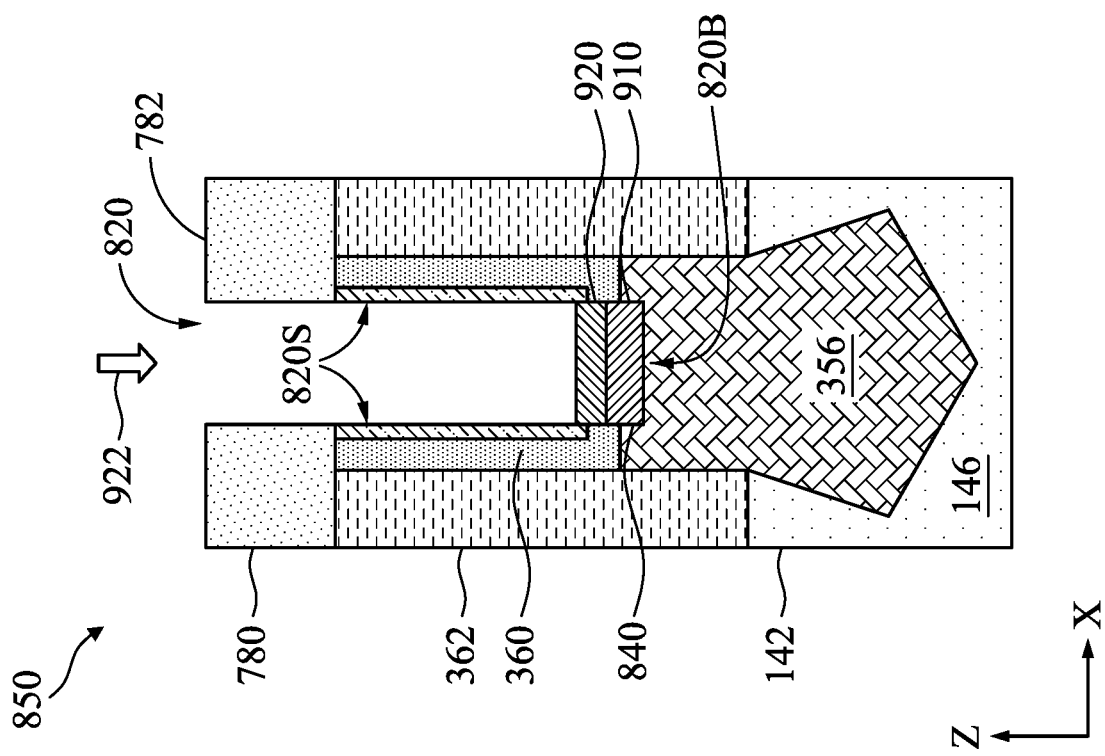

Turning to FIG. 9C, a metal capping layer 920 is selectively formed on the silicide layer 910. The metal capping layer 920 is a nitrogen-free metal capping layer, meaning that it does not contain or does not substantially contain nitrogen. The metal capping layer 920 serves as a protection layer like the previously used conventional metal nitride or nitridation layer and the metal capping layer 920 also facilitates subsequent bottom-up metal fill. Replacement of the previously used conventional metal nitride layer or nitridation layer with the metal capping layer 920 also reduces resistance within the formed contact structure.

As shown in FIG. 9C, the metal capping layer 920 selectively forms on the silicide layer 910 and does not form or does not substantially form on the sidewall 820S, which includes dielectric material. The selectivity originated from the nature of the precursor, which reacts with metallic substrate but not with dielectrics under specified temperature range. Thus, the metal capping layer 920 is non-conformal and does not extend along the sidewalls 820S. The metal capping layer 920 can be or include molybdenum, tungsten, or a combination thereof. In some embodiments, the metal capping layer 920 includes a nitride-free or nitrogen-free metal. In some embodiments, the metal capping layer 920 is formed by a cyclic deposition process 922. The cyclic deposition process 922 can be an atomic layer deposition (ALD) process, a cyclic chemical vapor deposition (CCVD) process, or a combination thereof. Precursors used during the cyclic deposition process 922 include molybdenum chloride (MoClx, where x=2-6) precursors, tungsten chloride (WClx, where x=2-6) precursors, or a combination thereof. In some embodiments, the molybdenum chloride precursor and the tungsten chloride precursor can be replaced with other molybdenum halide or tungsten halide precursors, for example, a molybdenum iodide precursor, a molybdenum bromide precursor, a tungsten iodide precursor, or a tungsten bromide precursor. In some embodiments, the molybdenum chloride precursor can be or include molybdenum (II) chloride, molybdenum (III) chloride, molybdenum (IV) chloride, molybdenum (V) chloride, molybdenum (IV) chloride, or a combination thereof. In particular embodiments, the molybdenum chloride precursor can be or include molybdenum (V) chloride that is molybdenum pentachloride ($MoCl_5$). In some embodiments, the tungsten chloride precursor can be or include tungsten (II) chloride, tungsten (III) chloride, tungsten (IV) chloride, tungsten (V) chloride, tungsten (IV) chloride, or a combination thereof. In particular embodiments, the tungsten chloride precursor can be or include tungsten (V) chloride that is tungsten pentachloride ($WCl_5$). The precursors used during the cyclic deposition process 922 are non-fluoride precursors meaning that the precursors do not contain fluoride (e.g., molybdenum fluorides, tungsten fluorides) since fluoride can damage the deposited silicide layer 910 by etching. Further, the precursors used during the cyclic deposition process 922 are non-oxide precursors meaning that the precursors do not contain oxygen (e.g., molybdenum oxyhalides, tungsten oxyhalides) since oxygen can also damage the deposited metal silicide by oxidation. In some embodiments, the metal capping layer 920 comprises molybdenum, tungsten, or a combination thereof. In some embodiments, the metal capping layer 920 has a thickness in a range from about 1 nm to about 20 nm. In some embodiments, the cyclic deposition process 922 is performed in the same chamber, or on the same platform, as the deposition process 912 without exposing the silicide layer 910 to atmosphere.

A non-limiting example embodiment of the cyclical deposition process 922 includes ALD, wherein ALD is based on self-controlling reactions, whereby sequential and alternating pulses of reactants are used to deposit about one atomic (or molecular) monolayer of material (might be a few angstroms thick) per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different reactant that reacts with the previous termination to enable continued deposition. Thus, each cycle of alternated pulses typically leaves no more than about one monolayer of the desired material. However, the skilled artisan will recognize that in one or more ALD cycles more than one monolayer of material may be deposited, for example, if some gas phase reactions occur despite the alternating nature of the process.

An ALD process utilized for the formation of a molybdenum metal capping layer or a tungsten metal capping layer selectively on a metal silicide layer, for example, the silicide layer 910, may include exposing the substrate to a first vapor phase reactant, removing any unreacted first reactant and reaction byproducts from the reaction chamber, and exposing the substrate to a second vapor phase reactant, followed by a second removal step. The first vapor phase reactant and the second vapor phase reactant may be pulsed. In some embodiments, the first vapor phase reactant may include a metal chloride precursor, for example, a molybdenum chloride precursor, or a tungsten chloride precursor and the second vapor phase reactant may include a reducing agent precursor, such as hydrogen gas. In other embodiments, the first vapor phase reactant may include the reducing agent and the second vapor phase reactant may include the molybdenum chloride precursor or the tungsten chloride precursor. The pulses of vapor phase reactants may be separated by an inert gas pulse, such as argon (Ar), helium, or other suitable inert gases, to prevent gas-phase reactions between reactants and enable self-saturating surface reactions.

Figure 13:
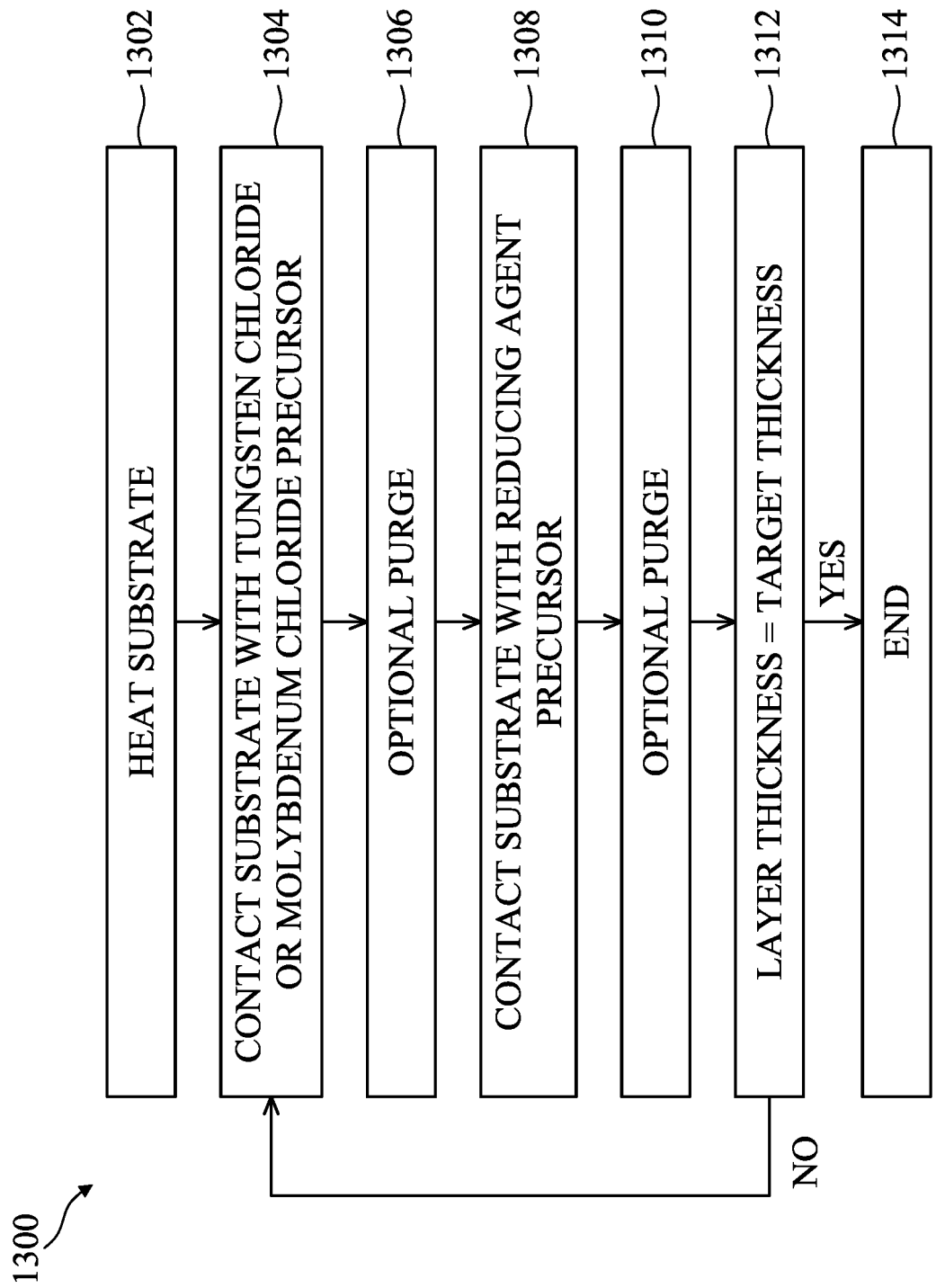
FIG. 13 is a flowchart of a process for manufacturing a semiconductor device structure in accordance with some embodiments.

FIG. 13 is a flow chart of an ALD process 1300, which can be implemented as the cyclic deposition process 922 in FIG. 9C, according to some embodiments. At process block 1302, a substrate is prepared for an ALD process to form a metal capping layer, such as the metal capping layer 920. The substrate may include an exposed dielectric surface and an exposed metal silicide surface, for example, the semiconductor device structure 100 with exposed sidewalls 820S and the silicide layer 910. The substrate may be loaded into a deposition chamber. The deposition chamber may be an ALD reaction chamber, a CVD reaction chamber, or any other suitable reaction chamber.

The substrate may be heated to a desired temperature for the subsequent cyclical deposition process. For example, the substrate may be heated to a substrate temperature of less than approximately 450° C., or less than approximately 400° C., or less than approximately 350° C., or less than approximately 300° C., or even less than approximately 250° C. In some embodiments, the substrate temperature during the ALD process 1300 is in a range from about 200° C. to about 450° C., or in a range from about 200° C. to about 400° C., or in a range from about 200° C. to about 300° C., or even in a range from about 300° C. to about 400° C. At temperatures below 200° C., deposition on metal may not occur since it is difficult to remove adsorbed halides because there is not enough energy to form HCl or HF. At temperatures above 450° C., selectivity may diminish since gas phase decomposition may occur.

In addition, to achieving a desired deposition temperature, e.g., a desired substrate temperature, the ALD process 1300 may also regulate the pressure within the reaction chamber during deposition to obtain desirable characteristics of the deposited metal capping layer and achieve selective deposition of the metal capping layer 920 on the silicide layer 910 without deposition on the dielectric surface of the sidewalls 820S. For example, in some embodiments, the ALD process 1300 may be performed within a reaction chamber regulated to a reaction chamber pressure of less than 50 Torr, or less than 20 Torr, or less than 10 Torr, or less than 5 Torr, or less than 3 Torr, or even less than 1 Torr. In some embodiments, the pressure within the reaction chamber during deposition may be regulated at a pressure in a range from about 0.1 Torr to about 50 Torr, or in a range from about 10 Torr to about 30 Torr, or in a range from about 30 Torr to about 50 Torr, or even in a range from about 0.1 Torr to about 5 Torr. At pressures below 0.1 Torr, deposition may not occur. At pressures greater than 50 Torr, gas phase decomposition may occur due to higher collision rates.

At process block 1304, the substrate is exposed to a molybdenum chloride precursor (which can be referred to as a molybdenum chloride-containing pulse) or a tungsten chloride precursor (which can be referred to as a tungsten chloride-containing pulse). In some embodiments, the molybdenum chloride precursor and the tungsten chloride precursor can be replaced with other molybdenum halide or tungsten halide precursors, for example, a molybdenum iodide precursor, a molybdenum bromide precursor, a tungsten iodide precursor, or a tungsten bromide precursor. The molybdenum chloride precursor may include or be represented by the empirical formula MoClx, where x is 2-6. For example, as a non-limiting example, the first vapor phase reactant may include or be a molybdenum chloride, such as, molybdenum pentachloride ($MoCl_5$). In some embodiments, the tungsten halide precursor may include or be a tungsten chloride precursor. The tungsten chloride precursor may be represented by the empirical formula WClx, where x=2-6. For example, as a non-limiting example, the first vapor phase reactant may include or be a tungsten chloride, such as, tungsten hexachloride ($WCl_6$).

In some embodiments where a molybdenum chloride precursor is used, contacting the substrate with a first vapor phase reactant including a molybdenum chloride precursor may include contacting the molybdenum chloride precursor to the substrate for a time period in a range from about 0.1 seconds to about 60 seconds, from about 0.1 seconds to about 10 seconds, or from about 0.5 seconds to about 5.0 seconds. In addition, during the contacting of the substrate with the molybdenum chloride precursor, the flow rate of the molybdenum chloride precursor may be less than 1000 sccm, or less than 500 sccm, or less than 100 sccm, or less than 10 sccm, or even less than 1 sccm. In addition, during the contacting of the substrate with the molybdenum chloride precursor the flow rate of the molybdenum chloride precursor may range from about 0.01 to 1000 sccm or from about 0.01 to about 50 sccm.

In some embodiments where a tungsten chloride precursor is used, contacting the substrate with a first vapor phase reactant including a tungsten chloride precursor may include contacting the tungsten chloride precursor to the substrate for a time period in a range from about 0.1 seconds to about 60 seconds, from about 0.1 seconds to about 10 seconds, or from about 0.5 seconds to about 5.0 seconds. In addition, during the contacting of the substrate with the tungsten chloride precursor, the flow rate of the tungsten chloride precursor may be less than 1000 sccm, or less than 500 sccm, or less than 100 sccm, or less than 10 sccm, or even less than 1 sccm. In addition, during the contacting of substrate with the tungsten chloride precursor the flow rate of the tungsten chloride precursor may range from about 0.01 to 1000 sccm or from about 0.01 to about sccm.

At process block 1306, a purge process may be optionally performed to remove any remaining molybdenum chloride precursor or tungsten chloride precursor and any byproducts from the chamber. For example, excess first vapor phase reactant and reaction byproducts (if any) may be removed from the surface of the substrate, e.g., by pumping with an inert gas. In some embodiments, the purge process may include a purge cycle wherein the substrate surface is purged for a time period of less than approximately seconds, or less than approximately 3.0 seconds, or even less than approximately 2.0 seconds. Excess first vapor phase reactant, such as, for example, excess molybdenum chloride precursor or excess tungsten chloride precursor and any possible reaction byproducts may be removed with the aid of a vacuum, generated by a pumping system in fluid communication with the reaction chamber.

At process block 1308, the substrate is exposed to a reducing agent precursor (which can be referred to as a reducing agent pulse). Upon purging the reaction chamber with a purge cycle the ALD process 1300 may continue with a second stage of the cyclical deposition phase at process block 1308 which includes contacting the substrate with a second vapor phase reactant, and particularly contacting the substrate with a second vapor phase reactant including a reducing agent precursor ("the reducing precursor").

In some embodiments, the reducing agent precursor may include at least one of molecular hydrogen ($H_2$), hydrogen atoms (H), a hydrogen plasma, hydrogen radicals, or hydrogen excited species. In further embodiments, the reducing agent precursor may include at least one of silane ($SiH_4$), disilane ($Si_2H_6$), trisilane ($Si_3H_8$), germane ($GeH_4$), digermane ($Ge_2H_6$), borane ($BH_3$), or diborane ($B_2H_6$). In particular embodiments, the reducing agent precursor may include molecular hydrogen ($H_2$).

In some embodiments, contacting the substrate with the reducing agent precursor may include contacting the substrate with the reducing agent precursor for a time period in a range from about 0.01 seconds to about 100 seconds, from about 0.5 seconds to about 60 seconds, or from about 0.5 seconds to about 10.0 seconds. In addition, during the contacting of the substrate with the reducing agent precursor, the flow rate of the reducing agent precursor may be less than 60 slm, or less than 30 slm, or less than 15 slm, or less than 10 slm, or less than 5 slm, or less than 1 slm, or even less than 0.1 slm. In addition, during the contacting of the substrate with the reducing agent precursor to the substrate the flow rate of the reducing agent precursor may range from about 0.1 to 60 slm, from about 0.5 to 30 slm, or equal to or greater than 10 slm.

At process block 1310, a purge process may be optionally performed to remove any excess reducing agent precursor and reaction byproducts (if any). For example, HCl produced from the reaction of the reducing agent precursor with excess chlorine from the molybdenum chloride precursor or tungsten chloride precursor, may be removed from the surface of the substrate, e.g., by pumping while flowing an inert gas. In some embodiments, the purge process of process block 1310 may include purging the substrate surface for a time period in a range from about 0.1 seconds to about 30 seconds, or from about 0.5 seconds to about 3 seconds, or even from about 1 second to about 2 seconds.

Process blocks 1304-1310 constitute one ALD cycle, which includes two deposition phases (the process block 1304 and the process block 1308) and optionally two purge phases (the process block 1306 and the process block 1310). Each ALD cycle is a self-controlling process, where about one molybdenum or tungsten containing monolayer is deposited during each ALD cycle. The ALD cycle is repeated until a metal capping layer, such as the metal capping layer 920, reaches a desired (target) thickness. For example, at process block 1312, if a thickness of the metal capping layer 920 equals a target thickness (or is within a given threshold of the target thickness), then the ALD process 1300 ends at process block 1314. If the thickness of the metal capping layer 920 does not equal the target thickness (or is not within the given threshold of the target thickness), then the ALD process 1300 returns to process block 1304 to begin another ALD cycle. In some embodiments, the ALD cycle (the process blocks 1304-1310) is repeated until the metal capping layer 920 has a thickness of about 1 nm to about 20 nm. Additional steps can be provided before, during, and after the ALD process 1300, and some of the steps described can be moved, replaced, or eliminated for additional embodiments of the ALD process 1300.

It should also be appreciated that in some embodiments, the order of contacting the substrate with the first vapor phase reactant (e.g., the molybdenum chloride precursor or the tungsten chloride precursor) and the second vapor phase reactant (e.g., the reducing agent precursor) may be such that the substrate is first contacted with the second vapor phase reactant followed by the first vapor phase reactant. In addition, in some embodiments, the ALD process 1300 may include contacting the substrate with the first vapor phase reactant one or more times prior to contacting the substrate with the second vapor phase reactant one or more times. In addition, in some embodiments, the ALD process 1300 may include contacting the substrate with the second vapor phase reactant one or more times prior to contacting the substrate with the first vapor phase reactant one or more times.

In some embodiments the cyclical deposition process 922 may be a hybrid ALD/CVD or a CCVD process. In some embodiments, a cyclical chemical vapor deposition (CCVD) may include the introduction of two or more precursors into the reaction chamber wherein there may be a time period of overlap between the two or more precursors in the reaction chamber resulting in both an ALD component of the deposition and a CVD component of the deposition. For example, the CCVD process may include the continuous flow of one precursor and the periodic pulsing of a second precursor into the reaction chamber.

Figure 14:
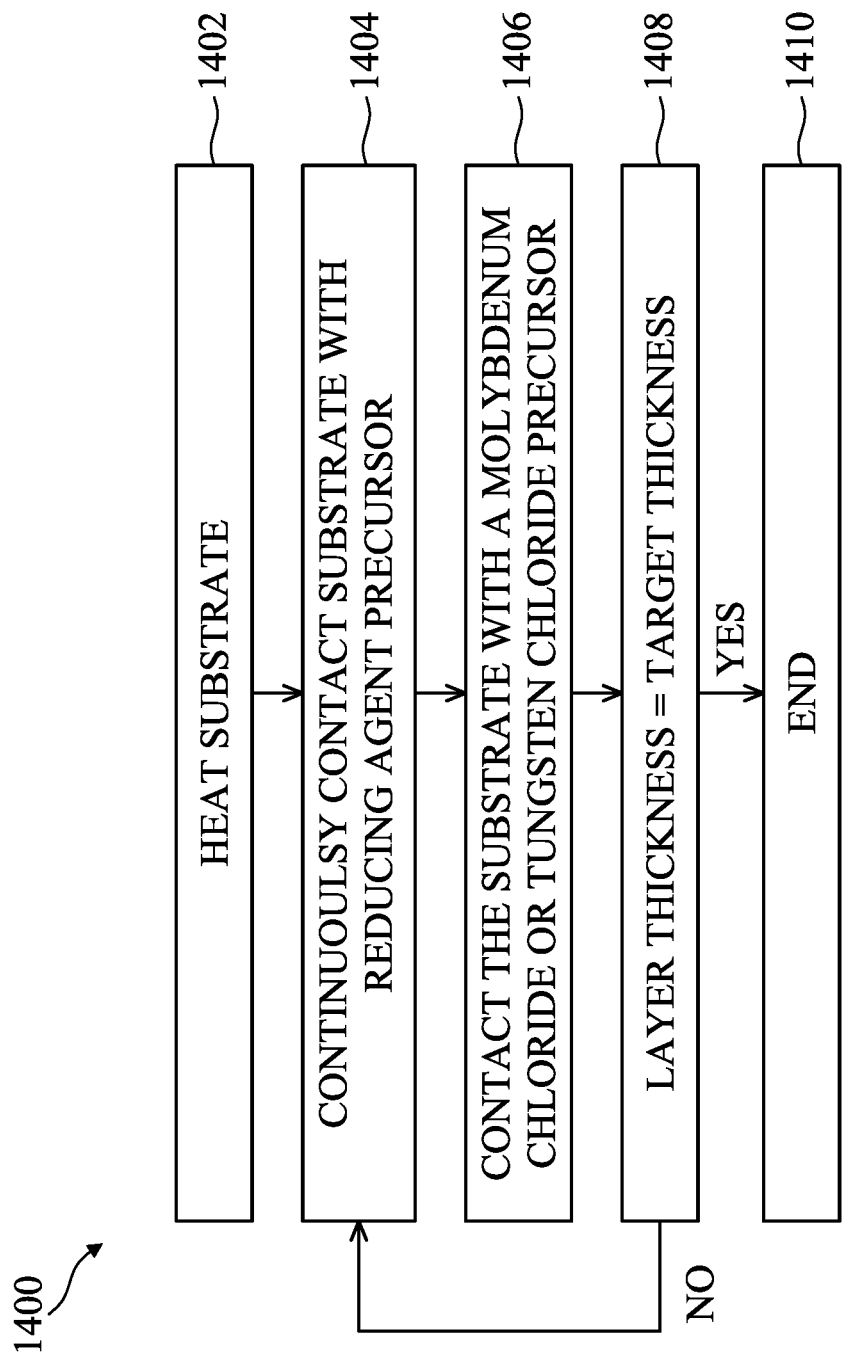
FIG. 14 is a flowchart of another process for manufacturing a semiconductor device structure in accordance with some embodiments.

Therefore, in alternative embodiments of the disclosure, a metal capping layer, such as the metal capping layer 920 may be deposited selectively on a metal silicide layer, such as the silicide layer 910 employing a CCVD process. FIG. 14 is a flow chart of a CCVD process 1400, which can be implemented as the cyclic deposition process 922 in FIG. 9C, according to some embodiments. It should be noted that the CCVD process 1400 includes certain process blocks which are equivalent, or substantially equivalent, to certain process blocks of the ALD process 1300 of FIG. 13, therefore equivalent process blocks are summarized in brief and the additional/modified process blocks are described in greater detail.

In more detail, the CCVD process 1400 may commence with a process block 1402 including providing a substrate including an exposed dielectric surface and an exposed metal silicide layer into a reaction chamber and heating the substrate to a deposition temperature. The process block 1402 has been described in detail with reference to the process block 1302 of FIG. 13 and therefore the details of the process block 1402 are not repeated with respect to the CCVD process 1400.

Upon heating the substrate to the desired deposition temperature and regulating the reaction chamber pressure, the CCVD process 1400 may continue with process block 1404 including continuously contacting the substrate with a reducing agent precursor. In more detail, the reducing agent precursor may be introduced into the reaction chamber and contact the substrate disposed in the reaction chamber at a flow rate of less than 60 slm, or less than 30 slm, or less than 15 slm, or less than 10 slm, or less than 5 slm, or less than 1 slm, or even less than 0.1 slm. In some embodiments, during the contacting of the substrate with the reducing agent precursor the flow rate of the reducing agent precursor may be in a range from about 0.1 to about 60 slm, from about 0.5 to about 30 slm, or equal to or greater than about 10 slm. The reducing agent precursor may include one or more of the reducing agent precursors described in detail with reference to the process block 1308 of the ALD process 1300.

At process block 1406, the CCVD process 1400 may continue by performing a cyclical deposition phase including contacting the substrate with a metal chloride precursor, for example, a molybdenum chloride precursor or a tungsten chloride precursor. Unlike the ALD process 1300, during the CCVD process 1400 the molybdenum chloride or the tungsten chloride precursor and the reducing agent precursor are present concurrently within the reaction chamber and therefore concurrently both the molybdenum chloride or tungsten chloride precursor and the reducing agent precursor contact the substrate and particularly contact a surface of the silicide layer 910. In other words, the process block 1406 includes co-flowing both the molybdenum chloride or tungsten chloride precursor and the reducing agent precursor into the reaction chamber and contacting the substrate with a gas mixture including at least the molybdenum chloride or the tungsten chloride precursor and the reducing agent precursor. The molybdenum chloride or the tungsten chloride precursor may include any one or more of the molybdenum chloride and tungsten chloride precursors described in detail with reference to the process block 1304 of the ALD process 1300.

In some embodiments where the molybdenum chloride precursor is used, contacting the substrate with the molybdenum chloride precursor at process block 1406 may include contacting the molybdenum chloride precursor to the substrate for a time period in a range from about 0.1 seconds to about 60 seconds, from about 0.5 seconds to about 10 seconds, or even from about 0.5 seconds to about 5.0 seconds. In addition, during the contacting of the substrate with the molybdenum chloride precursor, the flow rate of the molybdenum chloride precursor may be less than 1000 sccm, or less than 500 sccm, or less than 100 sccm, or less than 10 sccm, or even less than 1 sccm. In addition, during the contacting of substrate with the molybdenum chloride precursor the flow rate of the molybdenum chloride precursor may be in a range from about 0.01 to about 1000 sccm or from about 0.01 to about 50 sccm.

In some embodiments where the tungsten chloride precursor is used, contacting the substrate with the tungsten chloride precursor at process block 1406 may include contacting the tungsten chloride precursor to the substrate for a time period in a range from about 0.1 seconds to about 100 seconds, from about 0.5 seconds to about 60 seconds, or from about 0.5 seconds to about 10 seconds. In addition, during the contacting of the substrate with the tungsten chloride precursor, the flow rate of the tungsten chloride precursor may be less than 1000 sccm, or less than 500 sccm, or less than 100 sccm, or less than 10 sccm, or even less than 1 sccm. In addition, during the contacting of substrate with the tungsten chloride precursor the flow rate of the tungsten chloride precursor may be in a range from about 0.01 to about 1000 sccm or even from about 0.01 to about 50 sccm.

The CCVD process 1400 is repeated until a metal capping layer, such as the metal capping layer 920, reaches a desired (target) thickness. For example, at process block 1408, if a thickness of the metal capping layer 920 equals a target thickness (or is within a given threshold of the target thickness), then the CCVD process 1400 ends at process block 1410. If the thickness of the metal capping layer 920 does not equal the target thickness (or is not within the given threshold of the target thickness), then the CCVD process 1400 returns to process block 1404 to begin another CCVD cycle. In some embodiments, the CCVD cycle (process blocks 1404-1408) is repeated until the metal capping layer 920 has a thickness in a range from about 1 nm to about 20 nm. The CCVD process 1400 therefore includes continuously flowing the reducing agent precursor and periodically introducing the molybdenum chloride or tungsten chloride precursor into the reaction chamber to selectively deposit a metal capping layer on a surface of a metal silicide layer. Additional steps can be provided before, during, and after the CCVD process 1400, and some of the steps described can be moved, replaced, or eliminated for additional embodiments of the CCVD process 1400.

In alternative embodiments, an exemplary CCVD process may include continuously flowing the molybdenum chloride or the tungsten chloride precursor at process block 1404 and periodically introducing the reducing agent precursor into the reaction chamber at process block 1406 to selectively deposit a metal capping layer directly on a surface of a metal silicide layer.

In other alternative embodiments, an exemplary CCVD process may include co-flowing the molybdenum chloride or the tungsten chloride precursor with the reducing agent precursor into the reaction chamber followed by a purge process similar to the process block 1302 of FIG. 13 to selectively deposit a metal capping layer directly on a surface of a metal silicide layer.

The deposition processes, for example, the cyclic deposition process 922, described herein may deposit a molybdenum metal film or a tungsten metal film selectively on an exposed surface of a metal silicide layer, for example, the silicide layer 910, at a growth rate from about 0.01 Angstroms/cycle to about 10 Angstroms/cycle, from about 0.5 Angstroms/cycle to about 5 Angstroms/cycle, or even from about 1 Angstrom/cycle to about 2 Angstroms/cycle. In some embodiments, the growth rate of the molybdenum metal film or the tungsten metal film selectively on the exposed surface of the metal silicide is more than about 0.01 Angstroms/cycle, more than about 1 Angstrom/cycle, or even more than about 2 Angstroms/cycle. In some embodiments of the disclosure, the molybdenum metal film may be deposited at a growth rate of approximately 1 Angstroms/cycle.

In some embodiments, the metal capping layer 920 formed may have a thickness in a range from about 10 Angstroms to about 200 Angstroms, or from about 50 Angstroms to about 200 Angstroms, or even from about 100 Angstroms to about 150 Angstroms. In some embodiments, the metal capping layer 920 deposited according to some of the embodiments described herein may have a thickness greater than about 10 Angstroms, or greater than about 20 Angstroms, or greater than about 30 Angstroms, or greater than about 40 Angstroms, or greater than about 50 Angstroms, or greater than about 60 Angstroms, or greater than about 100 Angstroms, or greater than about 200 Angstroms.

In some embodiments, the metal capping layer 920 may have a thickness of less than about 250 Angstroms, or less than about 200 Angstroms, or less than about 100 Angstroms, or less than about 50 Angstroms, or less than about 25 Angstroms, or less than about 10 Angstroms, or even less than about 5 Angstroms.

In some embodiments, after deposition of the metal capping layer 920 the substrate is exposed to a plasma treatment process. The plasma treatment process can be an $NH_3$ plasma treatment process or an $O_2$ plasma treatment process. In some embodiments the $NH_3$ plasma treatment process includes flowing $NH_3$ in a range from about 10 to about 1000 sccm at a pressure within the reaction chamber in a range from about 0.5 Torr to about 10 Torr, and a power in a range from about 50 Watts to about 500 Watts. In some embodiments the $O_2$ plasma treatment process includes flowing $O_2$ in a range from about 10 to about 1000 sccm at a pressure within the reaction chamber in a range from about 0.1 Torr to about 30 Torr, and a power in a range from about 50 Watts to about 500 Watts. The plasma treatment process reduces deposition of the subsequent conductive fill material on exposed dielectric surfaces. Thus, in some embodiments, the plasma treatment reduces deposition of the conductive fill material on the top surface 782 of the second ILD 780. In addition, in some embodiments, the plasma treatment process, improves bottom-up fill within the opening 820 by reducing deposition of the conductive fill material on the sidewalls 820S of the opening 820.

Referring to FIG. 9D and FIG. 8, a deposition process 950 is performed to fill the openings 810, 820 and 830 with a conductive material 930 to form the contact plugs 952, 954, and 956 (see FIG. 9E and FIG. 10) in the openings 810, 820, and 830, respectively. Each of the contact plugs 952, 954, and 956 includes the conductive material 930 and the metal capping layer 920. In some embodiments, the conductive material 930 may be or include W, Co, Mo, Ru, Cu, a combination thereof, or the like. In some embodiments, the conductive material 930 may be or include the same conductive material as the conductive material of the metal capping layer 920. In other embodiments, the conductive material 930 is different from the conductive material of the metal capping layer 920. The deposition process 950 may be any suitable deposition process such as CVD, PVD, PECVD, ALD, an electrochemical plating process, an electroless plating process, a combination thereof, or the like.

In some embodiments, parameters of the deposition process 950 for the conductive material 930 are tuned, such that the conductive material 930 is deposited in the openings 810, 820 and 830 in a non-conformal bottom-up manner from the metal capping layer 920. In some embodiments, the parameters of the deposition process 950 are tuned, such that a deposition rate of the conductive material 930 on materials of the first ILD 362 and the second ILD 780 is reduced or suppressed compared to a deposition rate of the conductive material 930 on a material of the metal capping layer 920. In this manner, the conductive material 930 is selectively formed on the metal capping layer 920 and fills the openings 810, 820 and 830 in a bottom-up manner, which allows for reducing or avoiding the formation of voids in the conductive material 930. By reducing or avoiding the formation of the voids in the conductive material 930, the resistance of the contact plugs 952, 954 and 956 is reduced. In addition, replacing the previously used metal nitride layers with the metal capping layer 920 further reduces the resistance of the contact plugs 952, 954, and 956.

In some embodiments, the deposition process 950 for the conductive material 930 is different from the cyclic deposition process 922 for the metal capping layer 920. For example, the cyclic deposition process 922 may be a more selective process with a lower deposition rate such as an ALD process, and the deposition process 950 may be a less selective process with a higher deposition rate such as a CVD process or a plating process. This combination of a more selective slower process with a faster process helps achieve improved selectivity while maintaining or improving overall deposition rates, which reduces bottlenecks within the chamber/platform and reduces overall cost of ownership.

In some embodiments where the conductive material 930 includes W, the deposition process 950 may include CVD, ALD, or the like using a tungsten-containing precursor gas, such as tungsten carbonyls (e.g., $W(CO)_6$), tungsten fluorides (e.g., WFx where x=2-6 (e.g., $WF_4$, $WF_5$, or $WF_6$)), tungsten chlorides (e.g., WClx), or the like. In some embodiments, the tungsten-containing precursor gas may have a flow rate in a range from about 10 sccm to about 100 sccm. In some embodiments, in addition to the tungsten-containing precursor gas, a carrier gas and additional process gases may be used during the deposition. The carrier gas may comprise $N_2$, Ar, CO, $O_2$, a mixture thereof, or the like. The carrier gas may have a flow rate in a range from about 50 sccm and about 500 sccm. The additional process gas may comprise $H_2$, $O_2$, $NH_3$, a mixture thereof, or the like. The additional process gas may have a flow rate in a range from about 100 sccm to about 1000 sccm. In some embodiments, unlike the cyclic deposition process 922 for forming the metal capping layer 920, the reducing agent precursor, such as hydrogen gas, is not used in the deposition process 950 to form the conductive material 930. In some embodiments, the deposition process 950 may be performed at a temperature in a range from about 200° C. to about 450° C., for example, from about 200° C. to about 300° C., such as from about 200° C. to about 250° C. In some embodiments, the deposition process 950 may be performed at pressure in a range from about 0.1 Torr and about 50 Torr, for example, from about 0.1 Torr to about 10 Torr.

In some embodiments where the conductive material 930 includes Co, the deposition process 950 may comprise CVD, PECVD, ALD, using a cobalt-containing precursor gas, such as $Co_4(CO)_{12}$, $Co_2(CO)_8$, or the like. In other embodiments, the deposition process 950 may comprise a wet process such as an electrochemical plating process, an electroless plating process, a combination thereof, or the like. In some embodiments where cobalt is deposited using an electroless plating solution, the electroless plating solution generally includes water, a water-soluble compound containing cobalt (in ion form) to be deposited onto the target (substrate), a complexing agent that prevents chemical reduction of the cobalt ions in solution while permitting selective chemical reduction on a surface of the target, and a chemical reducing agent for the cobalt ions. Additionally, the plating solution may also include a buffer for controlling pH and various optional additives, such as solution stabilizers and surfactants. It is, of course, understood that the composition of the electroless cobalt plating solution will vary depending on the desired outcome. In some embodiments, the electroless cobalt plating solution may comprise cobalt ions (e.g., $Co^{2+}$ which may be provided by cobalt chloride ($CoCl_2$), cobalt sulfate ($CoSO_4$), and the like), a complexing agent (e.g., citric acid), $NH_4Cl$ (ammonium chloride), $(NH_4)_2SO_4$ (ammonium sulfate), and/or boric acid ($H_3BO_3$), as a buffer agent, DMAB (dimethylamine borane) and/or $H_2PO_2$ (phosphoric acid) as reducing agents, and a pH adjuster (e.g., TMAH (tetramethylammonium hydroxide)). In some embodiments, the electroless cobalt plating solution may be at a pH in a range from about 6 to about 9. In some embodiments, the electroless cobalt plating solution may be at a temperature in a range from about 10° C. to about 70° C.

In some embodiments where the conductive material 930 includes Mo, the deposition process 950 may comprise CVD, PECVD, ALD, or the like using a molybdenum-containing precursor gas, such as molybdenum fluorides (MoFx where x=2-6 (e.g., Mo4, Mo5, or $MoF_6$)), molybdenum carbonyls (e.g., $Mo(CO)_6$), molybdenum chlorides (e.g., MoClx), molybdenum oxychlorides (e.g., $MoO_xCl_y$, $MoOCl_4$, $MoOCl_3$, $MoO_2Cl_2$, or the like. In some embodiments, unlike the cyclic deposition process 922 for forming the metal capping layer 920, the reducing agent precursor, such as hydrogen gas, is not used in the deposition process 950 to form the conductive material 930. In some embodiments where the conductive material 930 is molybdenum, the deposition process 950 may be performed at a temperature in a range from about 200° C. to about 400° C., for example, from about 200° C. to about 300° C., such as from about 200° C. to about 250° C. In some embodiments where the conductive material 930 is molybdenum, the deposition process 950 may be performed at pressure in a range from about 0.1 Torr and about 50 Torr, for example, from about 0.1 Torr to about 10 Torr.

In some embodiments where the conductive material 930 includes Ru, the deposition process 950 may comprise CVD, PECVD, ALD, or the like. In some embodiments where the conductive material 930 includes Ru, the deposition process 950 may be performed using a ruthenium-containing precursor gas, such as $RuO_x$, $Ru(CO)_5$, $Ru_3(CO)_{12}$, $RuCl_3$, $Ru(od)_3$, Bis(cyclopentadienypruthenium(II), $Ru(CO)_3C_6H_8$, $Ru(CO)_2(tmhd)_2$, $Ru(EtCp)_2$, $Ru(CO)_2(acac)_2$, $Ru(C_6H_6)(C_6H_8)$, $Ru(DMBD)(CO)_3$, amidamate-based or hexadiene-based Ru precursors, a combination thereof, or the like. In some embodiments where the conductive material 930 includes Ru, the precursor gas may have a flow rate in a range from about 10 sccm to about 100 sccm. In some embodiments where the conductive material 930 includes Ru, in addition to the precursor gas, a carrier gas and additional process gases may be used during the deposition. The carrier gas may comprise $N_2$, Ar, CO, $O_2$, a mixture thereof, or the like. The carrier gas may have a flow rate in a range from about 50 sccm to about 500 sccm. The additional process gas may comprise $H_2$, $O_2$, $NH_3$, a mixture thereof, or the like. The additional process gas may have a flow rate in a range from about 100 sccm to about 1000 sccm. In some embodiments where the conductive material 930 includes Ru, the deposition process 950 may be performed at a temperature in a range from about 100° C. to about 400° C., such as in a range from about 100° C. to about 200° C. In some embodiments where the conductive material 930 includes Ru, the deposition process may be performed at pressure in a range from about 0.1 mTorr to about 10 mTorr, for example, from about 1 mTorr to about 10 mTorr.

In some embodiments where the conductive material 930 includes copper, the deposition process 950 may comprise CVD, PECVD, ALD, or the like. In other embodiments, the deposition process 950 may comprise a wet process such as an electrochemical plating process, an electroless plating process, a combination thereof, or the like. In some embodiments where copper is deposited using an electrochemical plating process, the electrochemical plating solution generally includes water and a water-soluble compound containing copper (in ion form). The electrochemical plating solution may further include additional additives such as leveling agents, suppressing agents, and/or accelerating agents. Additionally, the electrochemical plating solution may also include a buffer for controlling pH and various optional additives, such as solution stabilizers and surfactants. It is, of course, understood that the composition of the electrochemical copper plating solution will vary depending on the desired outcome.

In some embodiments, the electrochemical copper plating solution includes Cu ions (e.g., $Cu^{2+}$ which may be provided by copper chloride ($CuCl_2$), copper sulfate ($CuSO_4$), and the like). The electrochemical copper plating solution may further include additional additives such as $C_XH_YN_Z$ polymers and/or $CH_XO_Y$ polyethers. In some embodiments, the copper electroplating solution may be at a pH in a range from about 7 to about 10. In some embodiments, the copper electroplating solution may be at a temperature in a range from about 25° C. to about 80° C.

The various processes for forming the conductive material 930 described above may be different from the processes for forming the metal capping layer 920. In some embodiments, the process for forming the metal capping layer 920 is a slower and more selective process compared to the process for forming the conductive material 930. The metal capping layer 920 includes Mo or W, while the conductive material 930 includes Ru, Co, or Cu in addition to Mo or W, because the chlorine-based precursors for Mo or W are more selective than the precursors for the materials of the conductive material 930. In addition, the additional materials may be used for the conductive material 930 can be formed at a faster rate.

Figure 9E:
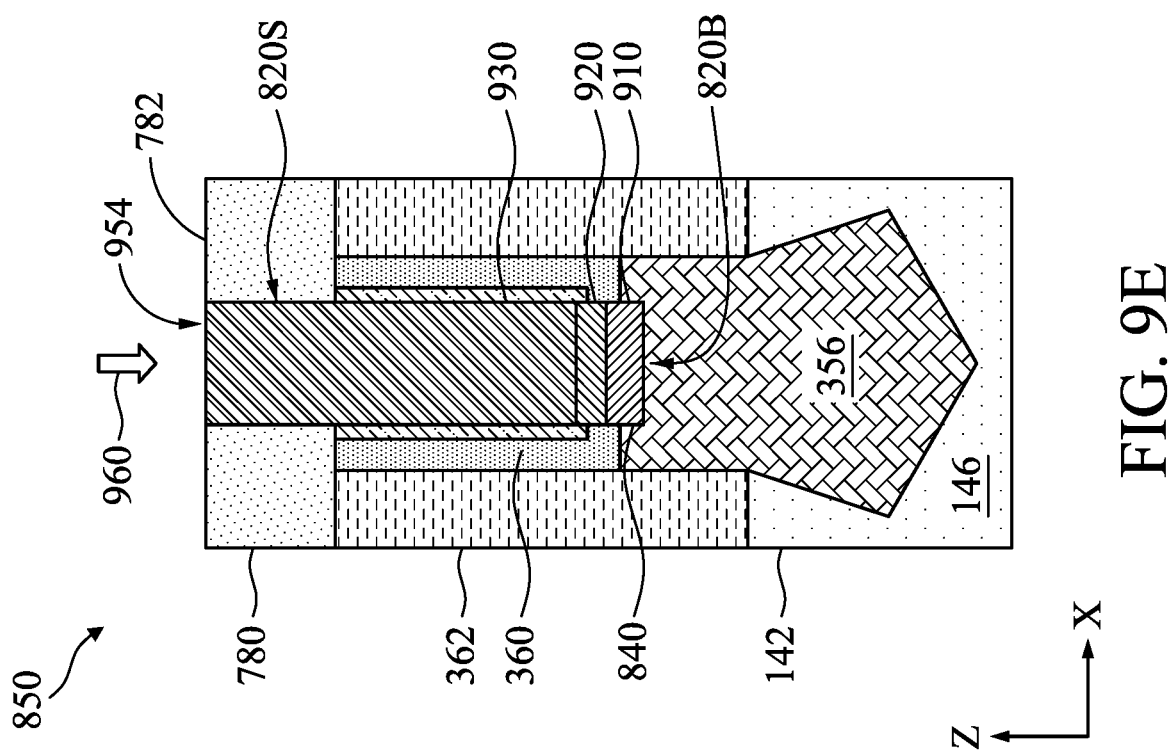
Figure 10:
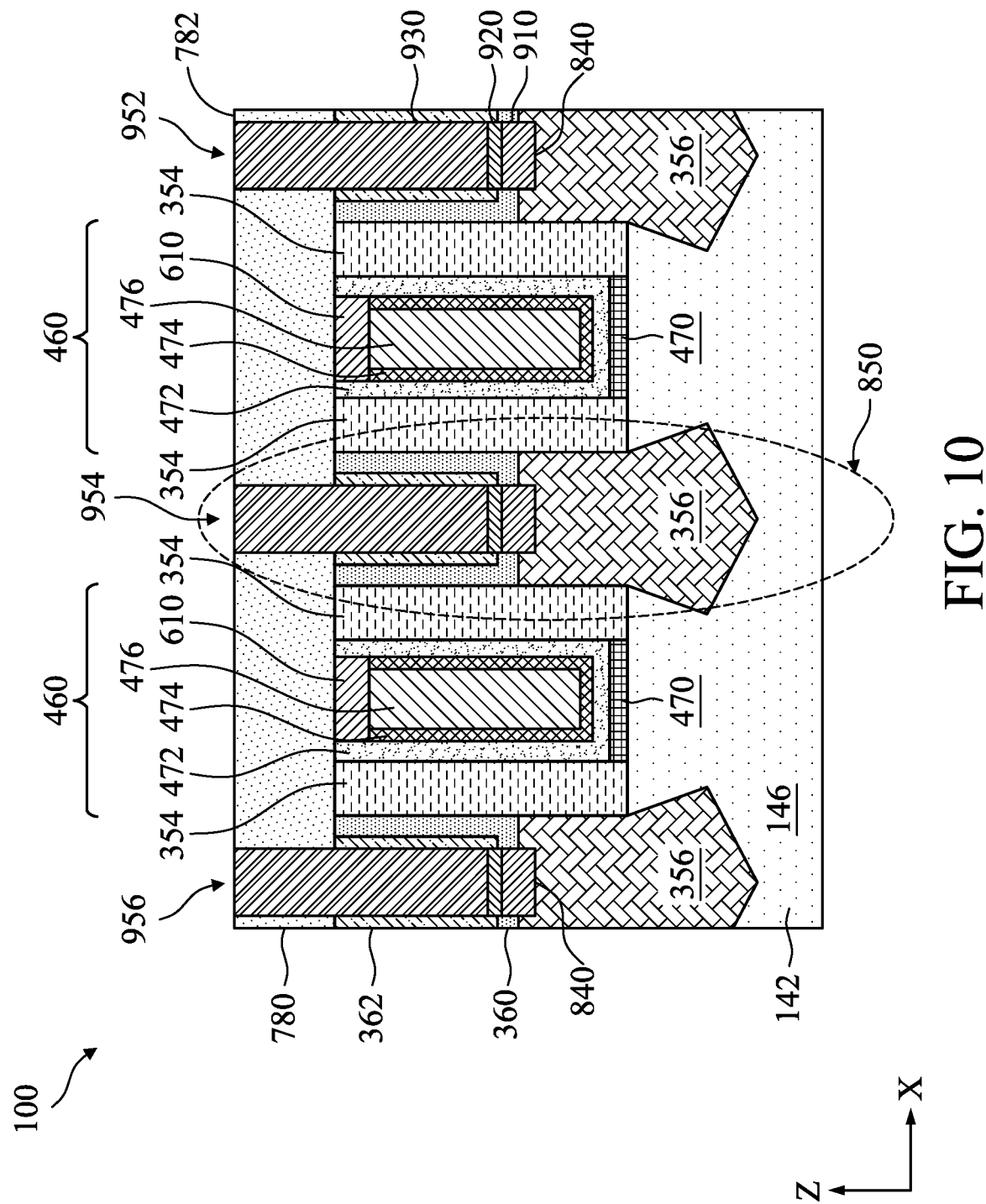

Referring to FIG. 9E, after filling the openings 810, 820 and 830 with the conductive material 930, a planarization process 960, such as a CMP process, may be performed to remove excess portions 970 or overburden of the conductive material 930 (if present) and any other materials present on the top surface 782 of the second ILD 780. After completing the planarization process, the top surfaces of the contact plugs 952, 954 and 956 may be coplanar or level with the top surface 782 of the second ILD 780 as shown in FIG. 9E and FIG. 10. In the embodiment illustrated in FIG. 10, the contact plugs 952, 954 and 956 are formed without forming conventional metal nitride barrier layers and/or nitridation on the metal silicide layers in the openings 810, 820 and 830 prior to filling the openings 810, 820 and 830 with the conductive material 930. By omitting the metal nitride barrier layers and/or nitridation, gapfill capability for the openings 810, 820 and 830 is improved, formation of voids in the conductive material 930 is reduced or avoided, and the resistance of the contact plugs 952, 954 and 956 is reduced.

Figure 11B:
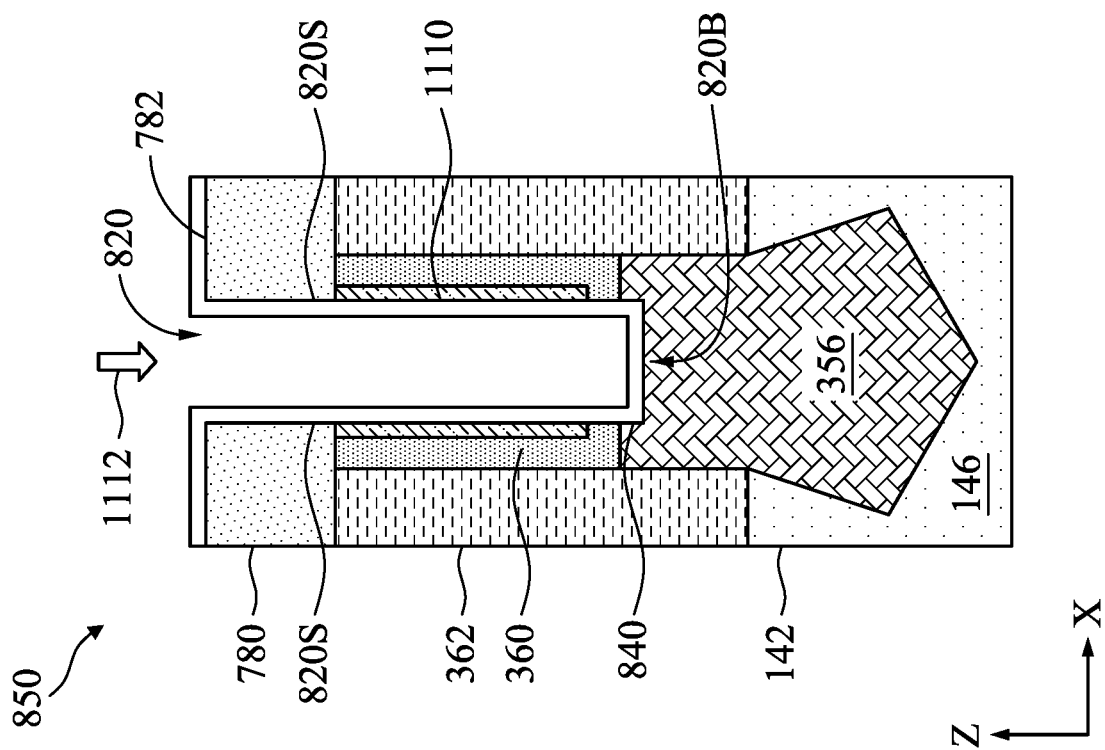
Figure 11A:
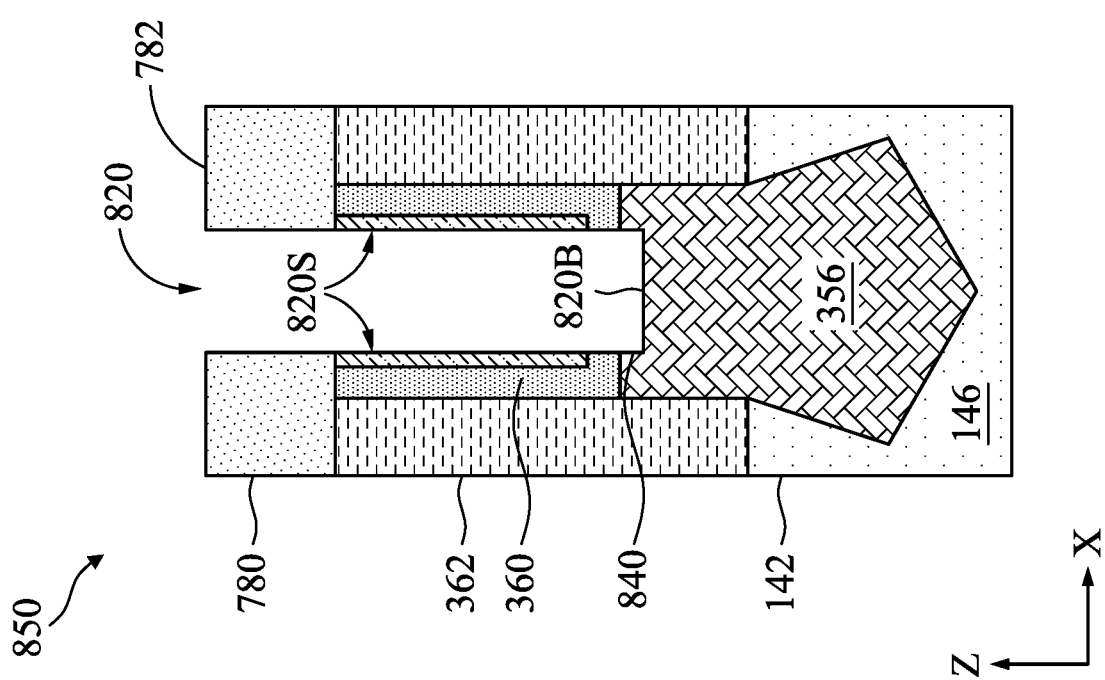

FIGS. 11A-11H are enlarged views of the portion 850 of the semiconductor device structure 100 of FIG. 8 during various manufacturing stages, in accordance with some embodiments. FIG. 11A is an enlarged view of the portion 850 of the semiconductor device structure 100 shown in FIG. 8. Next, as shown in FIG. 11B, a deposition process 1112 is performed to form a protective liner 1110 on the sidewall 820S, on the second ILD 780, and on the bottom surface 820B, for example, the exposed surface of the epitaxial source/drain region 356 of the opening 820. In some embodiments, the protective liner 1110 may be or include materials such as SiC, LaO, AlO, AlON, ZrO, HfO, SiN, ZnO, ZrN, ZrAlO, TiO, TaO, YO, TaCN, ZrSi, SiOCN, SiOC, SiCN, a combination thereof, or the like. In some embodiments, the deposition process 1112 is an ALD process, a CVD process, a PVD process, or a high-density plasma (HDP) process. In some embodiments, the protective liner 1110 has a thickness in a range from about 1 nm to about 10 nm and the opening 820 has a size in a range from about 4 nm to about 50 nm. In some embodiments, the protective liner 1110 maintains the critical dimensions (CD) of the opening 820 during subsequent cleaning and/or etching operations. In some embodiments, the protective liner 1110 protects the gate electrode layer 476 from damage during subsequent cleaning and/or etching operations.

Figure 11D:
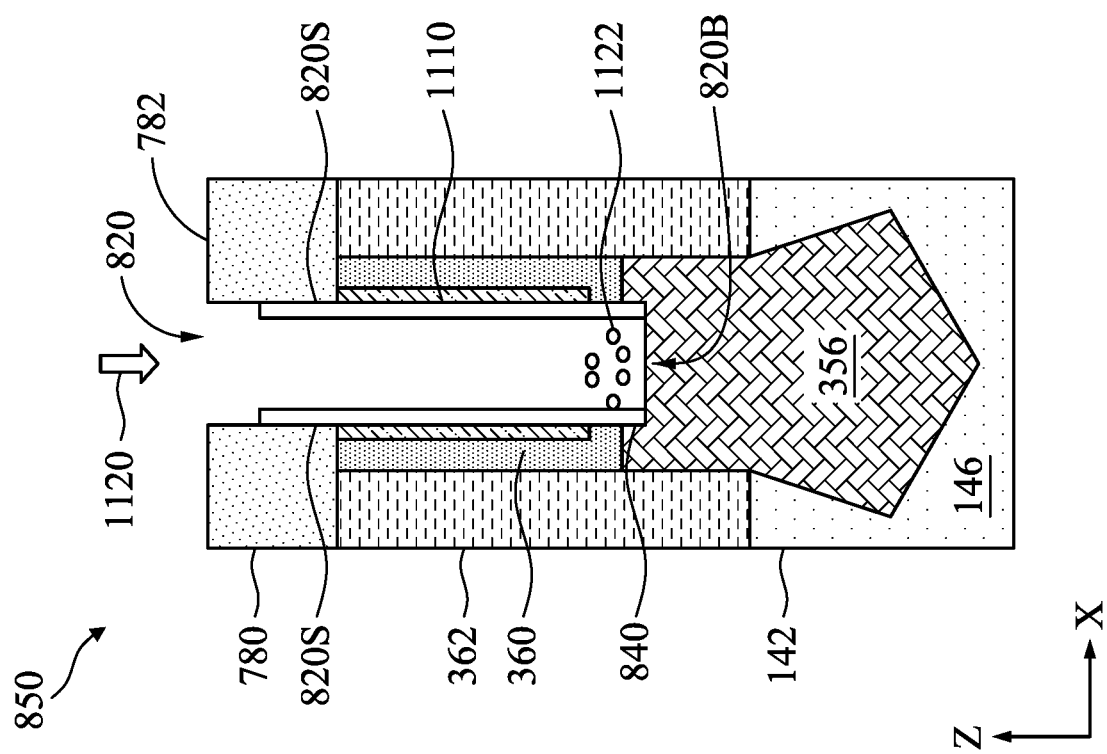
Figure 11C:
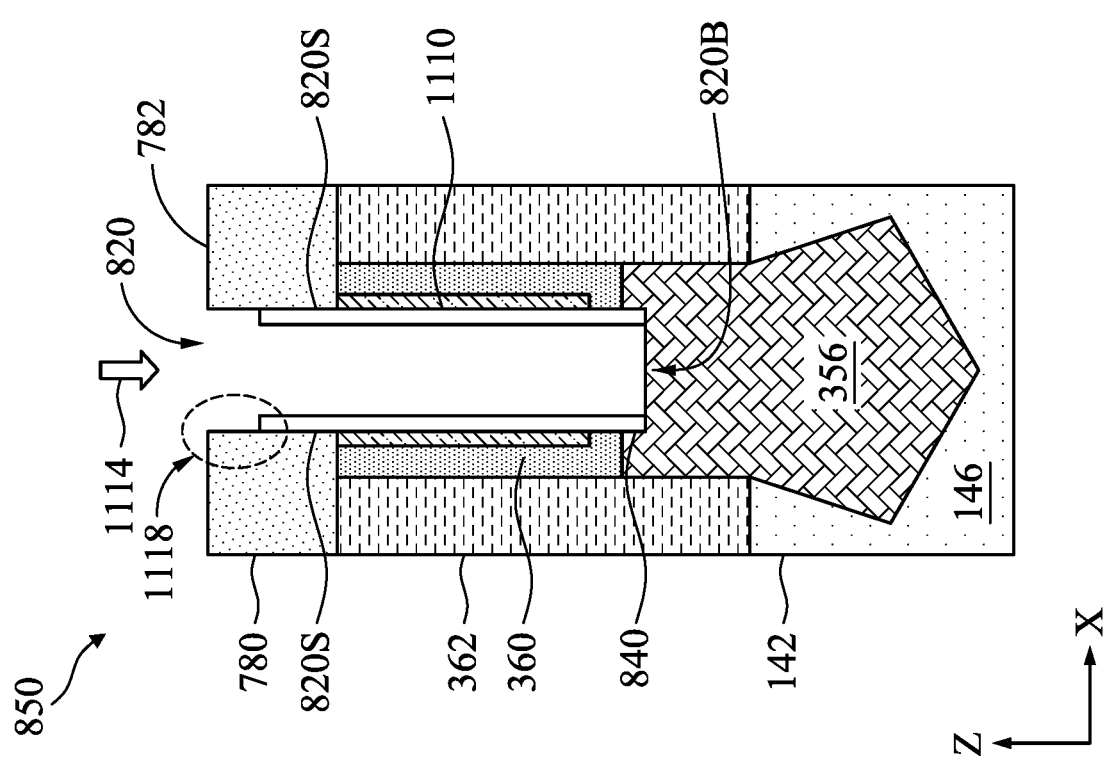

As shown in FIG. 11C, an etching operation 1114, for example, an anisotropic etching process, for example, a sputter etching operation, a plasma etching operation, an ion beam etching operation, or a reactive ion etching operation, is performed to remove a portion of the protective liner 1110 on the second ILD 780 and the bottom surface 820B exposing the epitaxial source/drain region 356. In some embodiments where the etching operation 1114 is a sputter etching operation, the sputter etching operation may be performed using an inert gas, for example, such as argon. In some embodiments, a top portion of the protective liner 1110 along the sidewall 820S is removed during etching operation 1114 to form a recessed portion 1118 of the protective liner 1110, which exposes a portion of the sidewall 820S. As depicted in FIG. 11C, the recessed portion 1118 extends from the top surface 782 of the second ILD 780 to the protective liner 1110. In some embodiments, the recessed portion 1118 extends a length in the z-direction in a range from about 1 nm to about 10 nm. In some embodiments, the length of the recessed portion 1118 can be used to monitor whether the protective liner 1110 has been removed from the bottom surface 820B to expose the epitaxial source/drain region 356. For example, if the length of the recessed portion 1118 is greater than 10 nm, the epitaxial source/drain region 356 has likely been over-etched and if the length of the recessed portion 1118 is less than 1 nm than it is likely that the protective liner 1110 has not been removed and the epitaxial source/drain region 356 has not been exposed.

As shown in FIG. 11D, a cleaning operation 1120 may be performed to remove remaining impurities 1122 present in the opening 820 from the etching operation 1114. In some embodiments, the cleaning operation 1120 uses an SPM solution to remove the remaining impurities 1122. In some embodiments, the SPM solution includes $H_2SO_4$ and $H_2O_2$. In some embodiments, the protective liner 1110 itself may also be used to protect the gate electrode layer 476 from being etched when the cleaning operation 1120 is being performed. Thus, the device performance and yield are improved.

As shown in FIG. 11E, silicide layer 1130 is formed through the opening 820 by a deposition process 1132. In some embodiments, the silicide layer 1130 may be formed using materials and deposition processes similar to the silicide layer 910 and the deposition process 912 described herein with reference to FIG. 9B and the description is not repeated herein. In some embodiments, the silicide layer 1130 is disposed on the epitaxial source/drain region 356 and is surrounded by the protective liner 1110.

As shown in FIG. 11F, metal capping layer 1140 is formed through the opening 820 by a deposition process 1142. In some embodiments, the metal capping layer 1140 may be formed using materials and deposition processes similar to the metal capping layer 920 and the cyclic deposition process 922 described herein with reference to FIG. 9C and the description is not repeated herein. In some embodiments, the metal capping layer 1140 is disposed on the silicide layer 1130 and is surrounded by the protective liner 1110.

Figure 11G:
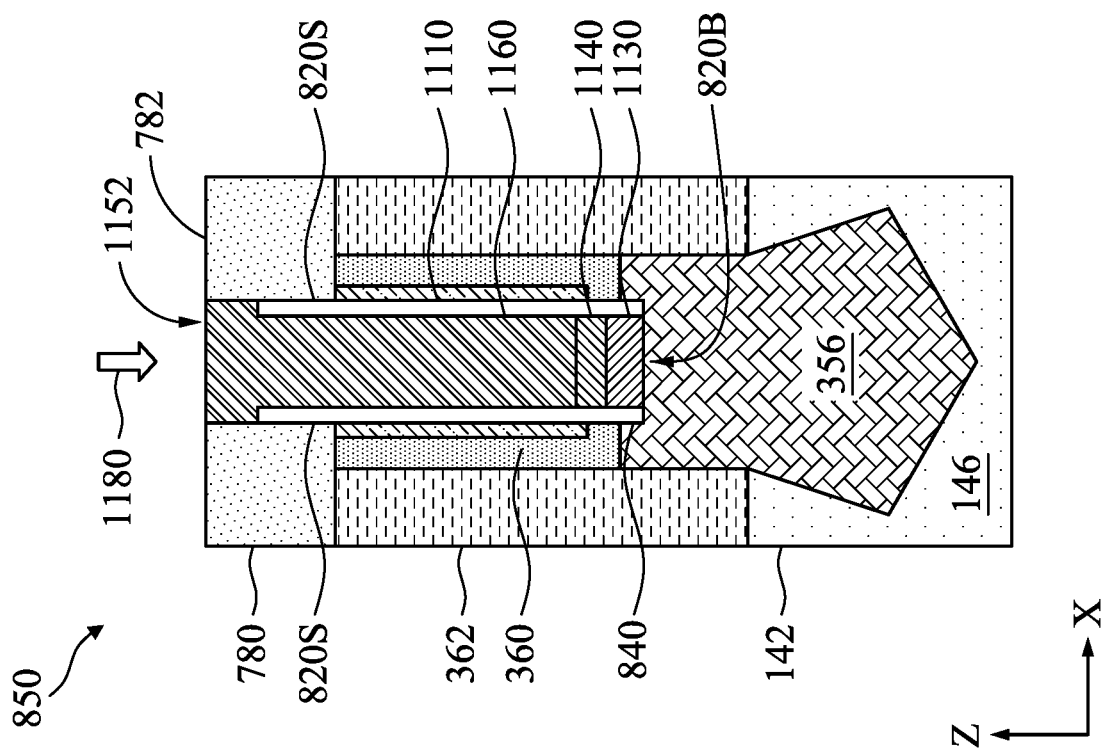
Figure 11H:
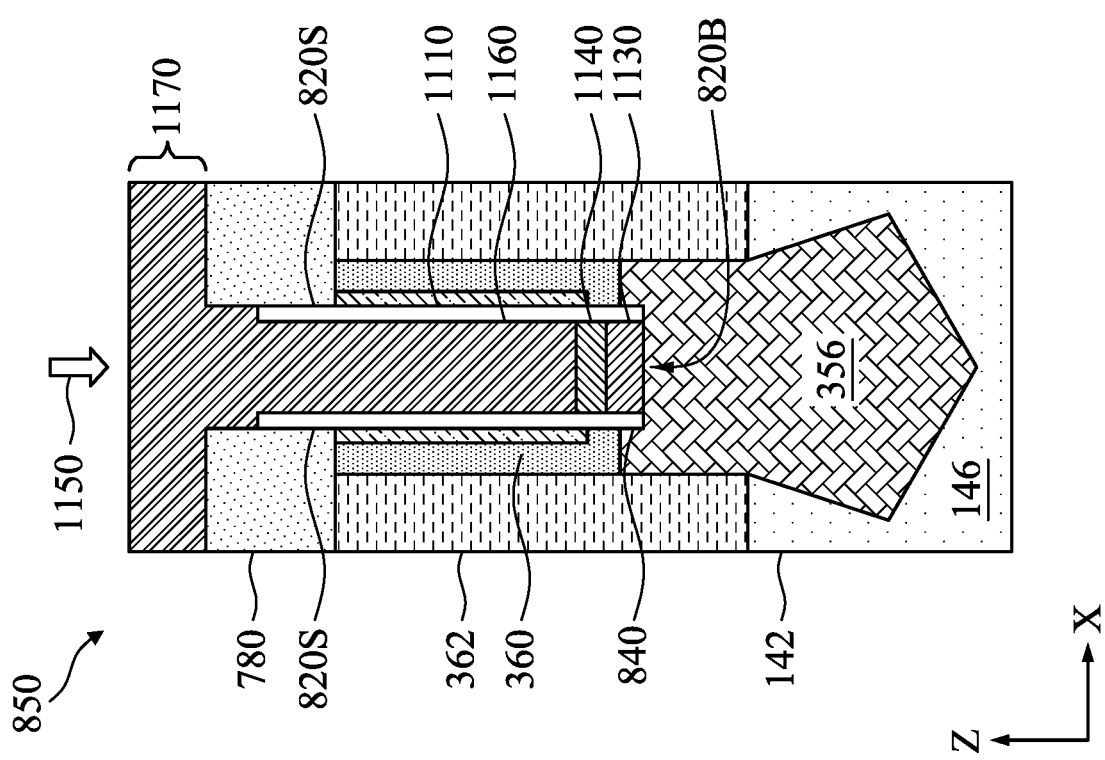

As shown in FIG. 11G, a deposition process 1150 is performed to fill the openings 810, 820 and 830 with a conductive material 1160 to form contact plugs 1152, 1154, and 1156 (see FIG. 11H and FIG. 12) in the openings 810, 820, and 830, respectively. In some embodiments, the contact plugs 1152, 1154 and 1156 may be formed using materials and deposition processes similar to the contact plugs 952, 954, and 956 and the deposition process 950 described herein with reference to FIG. 9D and the description is not repeated herein. In some embodiments, the conductive material 1160 may be or include the same conductive material as the conductive material of the metal capping layer 920. As depicted in FIG. 11H, the contact plug 1152 is disposed on the metal capping layer 1140 and is surrounded by the protective liner 1110, such that the contact plug 1152 is electrically connected to the epitaxial source/drain region 356 via the metal capping layer 1140 and the silicide layer 1130. In some embodiments where the top portion of the protective liner 1110 is removed to form the recessed portion 1118 (see FIG. 11C), the conductive material 1160 contacts the exposed portion of the sidewall 820S as shown in FIG. 11G.

Figure 12:
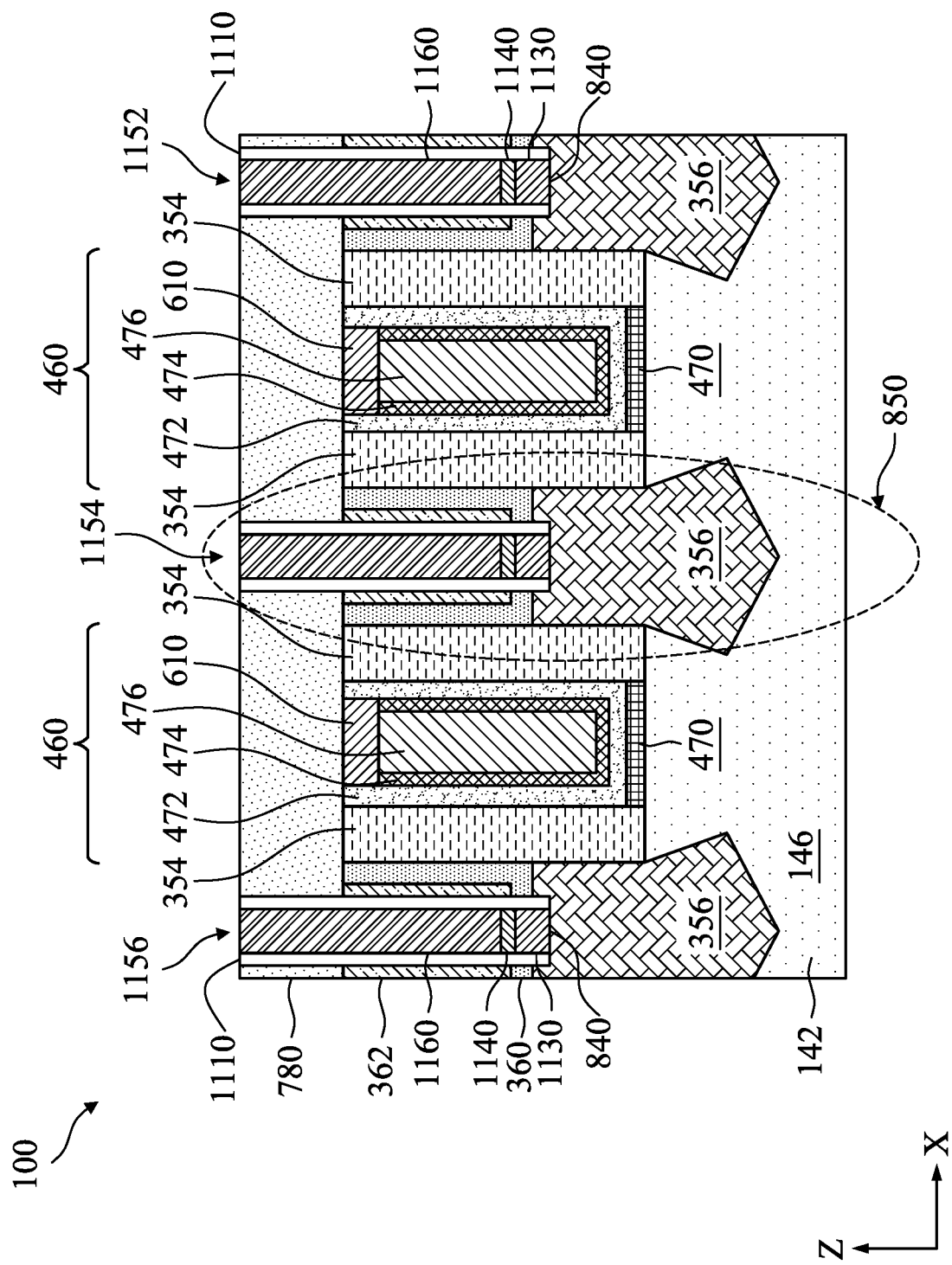

Referring further to FIG. 11H, after filling the openings 810, 820 and 830 with the conductive material 1160, a planarization process 1180, such as a CMP process, may be performed to remove excess portions 1170 or overburden of the conductive material 1160 (if present) and any other materials present on the top surface 782 of the second ILD 780. After completing the planarization process, top surfaces of the contact plugs 1152, 1154 and 1156 are coplanar or level with the top surface 782 of the second ILD 780 as shown in FIG. 11H and FIG. 12. In the embodiment illustrated in FIG. 12, the contact plugs 1152, 1154 and 1156 are formed without forming conventional metal nitride barrier layers or nitridation in the openings 810, 820 and 830 prior to filling the openings 810, 820 and 830 with the conductive material 1160. By omitting the conventional metal nitride barrier layers, gapfill capability for the openings 810, 820 and 830 is improved, formation of voids in the conductive material 1160 is reduced or avoided, and the resistance of the contact plugs 1152, 1154 and 1156 is reduced. In addition, the sidewalls 820S of the openings 810, 820 and 830 are coated with the protective liner 1110, which helps maintain the critical dimensions (CD) of the openings 810, 820 and 830 during subsequent cleaning or etching processes. Further, the protective liner 1110 can help protect the replacement gate structures 460 from damage during subsequent cleaning and etching processes.

According to an embodiment, a method of forming a semiconductor device structure is provided. The method includes forming a gate structure over a substrate, forming an epitaxial source/drain region adjacent to the gate structure, forming a dielectric layer over the epitaxial source/drain region, and forming an opening extending through the dielectric layer and exposing the epitaxial source/drain region. Sidewalls of the opening are defined by the dielectric layer and a bottom of the opening is defined by the epitaxial source/drain region. The method further includes forming a silicide layer on the epitaxial source/drain region, selectively forming a metal capping layer on the silicide layer by a first deposition process. The metal capping layer includes tungsten, molybdenum, or a combination thereof. The method further includes filling the opening with a first conductive material by a second deposition process different from the first deposition process. The first conductive material fills the opening in a bottom-up manner from the metal capping layer. In an embodiment, material of the metal capping layer is different from material of the first conductive material. In an embodiment, material of the metal capping layer is the same as the first conductive material. In an embodiment, the first deposition process is formed by a cyclic deposition process performed in a deposition chamber. In an embodiment, the cyclic deposition process includes introducing a gas comprising $WCl_5$, $MoCl_5$, or a combination thereof into the deposition chamber. In an embodiment, the cyclic deposition process is performed in at a temperature in a range from about 200° C. to about 400° C. at a pressure in a range from about 0.1 Torr to about 50 Torr. In an embodiment, the cyclic deposition process further includes introducing a reducing agent precursor gas into the deposition chamber. In an embodiment, the reducing gas is selected from molecular hydrogen ($H_2$), hydrogen atoms (H), a hydrogen plasma, hydrogen radicals, hydrogen excited species, or a combination thereof. In an embodiment, introducing the gas comprising $WCl_5$, $MoCl_5$, or a combination thereof and introducing the reducing agent precursor at least partially overlap. In an embodiment, introducing the gas comprising $WCl_5$, $MoCl_5$, or a combination thereof and introducing the reducing agent precursor occur sequentially. In an embodiment, the cyclic vapor deposition process is selected from an ALD process and a cyclic chemical vapor deposition process.

According to another embodiment, a method of forming a semiconductor device structure is provided. The method includes forming a contact opening in a dielectric layer. The contact opening has sidewalls defined by the dielectric layer and a bottom defined by an epitaxial source/drain region. The method further includes forming a silicide layer on the epitaxial source/drain region through the contact opening and forming a metal capping layer on the silicide layer. Forming the metal capping layer includes contacting the silicide layer with a first vapor phase reactant comprising a molybdenum chloride precursor or a tungsten chloride precursor and contacting the silicide layer with a second vapor phase reactant comprising a reducing agent precursor. The method further includes forming a conductive material over the metal capping layer in a bottom-up manner. The metal capping layer includes tungsten or molybdenum, and the conductive material includes a material different from tungsten or molybdenum. In an embodiment, the method further includes heating the substrate to a substrate temperature in a range from about 200° C. to about 400° C. and regulating the pressure within a reaction chamber during deposition to a range from about 1 torr to about 50 Torr. In an embodiment, the reducing agent precursor includes at least one of molecular hydrogen ($H_2$), atomic hydrogen (H), a hydrogen-based plasma, hydrogen radicals, hydrogen excited species, or a combination thereof. In an embodiment, the molybdenum chloride includes molybdenum pentachloride ($MoCl_5$). In an embodiment, the method includes at least one deposition cycle in which the silicide layer is alternatively and sequentially contacted with the first vapor phase reactant and the second vapor phase reactant. In an embodiment, the method includes at least one deposition cycle comprising periodically contacting the silicide layer with the first vapor phase reactant and continuously contacting the silicide layer with the second vapor phase reactant.

According to yet another embodiment, a method of forming a semiconductor device structure is provided. The method includes forming a contact opening in a dielectric layer. The contact opening has sidewalls defined by the dielectric layer and a bottom defined by an epitaxial source/drain region. The method further includes forming a silicide layer on the epitaxial source/drain region through the contact opening and performing an ALD process to selectively form a metal capping layer on the silicide layer. The metal capping layer does not form along the sidewalls of the opening. The method further includes forming a conductive bulk layer over the metal capping layer in a bottom-up manner. The metal capping layer and the conductive bulk layer fill the contact opening in a bottom-up manner. The metal capping layer includes tungsten or molybdenum. In an embodiment, a cycle of the ALD process includes a molybdenum chloride containing pulse phase, a first purge phase, a hydrogen-containing pulse phase, and a second purge phase. In an embodiment, the molybdenum chloride containing pulse phase includes exposing the silicide layer to a molybdenum chloride precursor. In an embodiment, the cycle of the ALD process is repeated until a thickness of the metal capping layer reaches a target thickness. In an embodiment, a cycle of the ALD process includes a tungsten chloride containing pulse phase, a first purge phase, a hydrogen-containing pulse phase, and a second purge phase. In an embodiment, the tungsten chloride containing pulse phase includes exposing the silicide layer to a tungsten chloride precursor. In an embodiment, the cycle of the ALD process is repeated until a thickness of the metal capping layer reaches a target thickness.

According to yet another embodiment, a semiconductor device structure is provided. The semiconductor device structure includes a substrate, an epitaxial source/drain region disposed over the substrate, a dielectric layer over the epitaxial source/drain region, and a conductive feature extending through the dielectric layer. The conductive feature is electrically coupled to the epitaxial source/drain region. The dielectric layer forms a sidewall surrounding the conductive feature. The semiconductor device structure further includes a protective liner extending along and in physical contact with the sidewall and the conductive feature. The protective liner is recessed exposing a portion of the sidewall extending a length from a top surface of the dielectric layer to the protective liner and the conductive feature contacts the portion of the sidewall. The semiconductor device structure further includes a metal capping layer interposed between the first epitaxial source/drain region and a bottom surface of the conductive feature. The semiconductor device structure further includes a silicide layer interposed between the first epitaxial source/drain region and the metal capping layer. The metal capping layer includes tungsten, molybdenum, or a combination thereof. In an embodiment, the length is in a range from about 1 nm to about 10 nm. In an embodiment, the metal capping layer includes molybdenum, and the conductive feature includes tungsten. In an embodiment, the metal capping layer and the conductive feature includes different materials. In an embodiment, the metal capping layer and the conductive feature include a same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor device structure, the method comprising:

forming a gate structure over a substrate;

forming an epitaxial source/drain region adjacent to the gate structure;

forming a dielectric layer over the epitaxial source/drain region, the dielectric layer comprising an opening exposing sidewalls of the dielectric layer and a top surface of the epitaxial source/drain region;

forming a silicide layer on the epitaxial source/drain region;

selectively forming a metal capping layer on and interfacing the silicide layer by a first deposition process, wherein the metal capping layer comprises tungsten, molybdenum, or a combination thereof; and filling the opening with a first conductive material by a second deposition process different from the first deposition process, wherein the first conductive material fills the opening in a bottom-up manner from the metal capping layer.

2. The method of claim 1, wherein material of the metal capping layer is different from the first conductive material.

3. The method of claim 1, wherein material of the metal capping layer is the same as the first conductive material.

4. The method of claim 1, wherein the first deposition process is formed by a cyclic deposition process performed in a deposition chamber.

5. The method of claim 4, wherein the cyclic deposition process comprises introducing a gas comprising $WCl_5$, $MoCl_5$, or a combination thereof into the deposition chamber.

6. The method of claim 5, wherein the cyclic deposition process is performed at a temperature in a range from about 200° C. to about 400° C. at a pressure in a range from about 0.1 Torr to about 50 Torr.

7. The method of claim 5, wherein the cyclic deposition process further comprises introducing a reducing agent precursor gas into the deposition chamber.

8. The method of claim 7, wherein the reducing agent precursor gas is selected from molecular hydrogen ($H_2$), hydrogen atoms (H), a hydrogen plasma, hydrogen radicals, hydrogen excited species, or a combination thereof.

9. The method of claim 7, wherein introducing the gas comprising $WCl_5$, $MoCl_5$, or a combination thereof and introducing the reducing agent precursor gas at least partially overlap.

10. The method of claim 7, wherein introducing the gas comprising $WCl_5$, $MoCl_5$, or a combination thereof and introducing the reducing agent precursor gas occur sequentially.

11. The method of claim 4, wherein the cyclic deposition process is selected from an ALD process and a cyclic chemical vapor deposition process.

12. A method of forming a semiconductor device structure, the method comprising:

forming a contact opening in a dielectric layer formed on a substrate, wherein the contact opening exposing sidewalls of the dielectric layer and a top surface of an epitaxial source/drain region;

forming a silicide layer on the epitaxial source/drain region through the contact opening;

forming a metal capping layer on and interfacing the silicide layer, wherein forming the metal capping layer comprises:

contacting the silicide layer with a first vapor phase reactant comprising a metal chloride precursor; and contacting the silicide layer with a second vapor phase reactant comprising a reducing agent precursor; and forming a conductive material over the metal capping layer in a bottom-up manner, wherein the metal capping layer comprises a nitride-free metal in physical contact with the epitaxial source/drain region.

13. The method of claim 12, further comprising heating the substrate to a substrate temperature in a range from about 200° C. to about 400° C. and regulating pressure within a reaction chamber during deposition to a range from about 1 torr to about 50 Torr.

14. The method of claim 12, wherein the reducing agent precursor comprises at least one of molecular hydrogen ($H_2$), atomic hydrogen (H), a hydrogen-based plasma, hydrogen radicals, hydrogen excited species, or a combination thereof.

15. The method of claim 14, wherein the metal chloride precursor comprises molybdenum pentachloride ($MoCl_5$).

16. The method of claim 12, wherein the method comprises at least one deposition cycle in which the silicide layer is alternatively and sequentially contacted with the first vapor phase reactant and the second vapor phase reactant.

17. The method of claim 12, wherein the method comprises at least one deposition cycle comprising periodically contacting the silicide layer with the first vapor phase reactant and continuously contacting the silicide layer with the second vapor phase reactant.

18. A method of forming a semiconductor device structure, the method comprising:
   forming a contact opening in a dielectric layer to expose an epitaxial source/drain region;
   forming a silicide layer on the epitaxial source/drain region through the contact opening;
   forming a metal capping layer on and interfacing the silicide layer, wherein forming the metal capping layer comprises:
      periodically contacting the silicide layer with a first vapor phase reactant comprising a metal chloride precursor; and
      continuously contacting the silicide layer with a second vapor phase reactant comprising a reducing agent precursor; and
   forming a conductive material over the metal capping layer.

19. The method of claim 18, wherein the metal capping layer and the conductive material comprise different materials.

20. The method of claim 19, wherein the conductive material comprises W, Co, Mo, Ru, or Cu.

* * * * *